United States Patent
Lee et al.

(10) Patent No.: US 12,022,710 B2
(45) Date of Patent: Jun. 25, 2024

(54) ORGANIC LIGHT EMITTING DISPLAY DEVICE

(71) Applicant: Samsung Display Co., Ltd., Yongin-Si (KR)

(72) Inventors: Seunghun Lee, Seoul (KR);
Myounghwa Kim, Seoul (KR);
Jaybum Kim, Seoul (KR);
Kyoung-seok Son, Seoul (KR);
Seungjun Lee, Suwon-si (KR);
Jun-hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 376 days.

(21) Appl. No.: 17/414,355

(22) PCT Filed: Mar. 6, 2019

(86) PCT No.: PCT/KR2019/002603
§ 371 (c)(1),
(2) Date: Jun. 16, 2021

(87) PCT Pub. No.: WO2020/145449
PCT Pub. Date: Jul. 16, 2020

(65) Prior Publication Data
US 2022/0028963 A1   Jan. 27, 2022

(30) Foreign Application Priority Data
Jan. 10, 2019   (KR) .................... 10-2019-0003177

(51) Int. Cl.
*H10K 59/131*   (2023.01)
*H10K 71/00*   (2023.01)
(Continued)

(52) U.S. Cl.
CPC ......... *H10K 59/1315* (2023.02); *H10K 71/00* (2023.02); *H10K 50/844* (2023.02);
(Continued)

(58) Field of Classification Search
CPC .. H10K 59/1315; H10K 71/00; H10K 50/844; H10K 59/1201; H10K 77/111;
(Continued)

(56) References Cited

U.S. PATENT DOCUMENTS

2014/0312320 A1   10/2014   Yang et al.
2015/0123084 A1   5/2015   Kim et al.
(Continued)

FOREIGN PATENT DOCUMENTS

JP   2011-187273 A   9/2011
KR   10-2006-0112375 A   11/2006
(Continued)

*Primary Examiner* — Yasser A Abdelaziez
(74) *Attorney, Agent, or Firm* — Innovation Counsel LLP

(57) ABSTRACT

An organic light emitting display device includes a substrate including a light emitting region, a first active layer having a source region and a drain region disposed in the light emitting region on the substrate, a gate insulation layer disposed on the first active layer, a first gate electrode disposed on the gate insulation layer, a first insulating interlayer disposed on the first gate electrode, a second insulating interlayer disposed on the first insulating interlayer, a first source electrode disposed on the second insulating interlayer, the first source electrode being connected to the source region of the first active layer through a contact hole formed in the gate insulation layer, the first insulating interlayer, and the second insulating interlayer, a protective insulating layer disposed on the first source electrode, a first drain electrode disposed on the protective insulating layer, the first drain electrode being connected to the drain region of the first active layer through a contact hole formed in the gate insulation layer, the first insulating interlayer, and the
(Continued)

protective insulating layer, the first drain electrode constituting a driving transistor together with the first active layer, the first gate electrode, and the first source electrode, a switching transistor disposed in the second region between the substrate and the protective insulating layer, a lower electrode disposed on the switching transistor and the driving transistor, a light emitting layer disposed on the lower electrode, and an upper electrode disposed on the light emitting layer.

20 Claims, 15 Drawing Sheets

(51) Int. Cl.
*H10K 50/844* (2023.01)
*H10K 59/12* (2023.01)
*H10K 77/10* (2023.01)
*H10K 102/00* (2023.01)

(52) U.S. Cl.
CPC ........ *H10K 59/1201* (2023.02); *H10K 77/111* (2023.02); *H10K 2102/311* (2023.02)

(58) Field of Classification Search
CPC ......... H10K 2102/311; H10K 50/8445; H10K 59/1213; H10K 59/124; H10K 59/131; H10K 59/35; H10K 50/80; H01L 27/1251
See application file for complete search history.

(56) References Cited

U.S. PATENT DOCUMENTS

| | | | |
|---|---|---|---|
| 2016/0141348 A1 | 5/2016 | Lin et al. | |
| 2016/0254337 A1 | 9/2016 | Choi et al. | |
| 2017/0069701 A1* | 3/2017 | Cai | H10K 71/00 |
| 2017/0288007 A1* | 10/2017 | Shin | H10K 71/00 |
| 2018/0122835 A1 | 5/2018 | Watakabe et al. | |
| 2020/0194519 A1* | 6/2020 | Guo | H10K 50/844 |
| 2021/0336061 A1 | 10/2021 | Son et al. | |
| 2022/0059634 A1 | 2/2022 | Son et al. | |

FOREIGN PATENT DOCUMENTS

| | | |
|---|---|---|
| KR | 10-2007-0072207 A | 7/2007 |
| KR | 10-2014-0055529 A | 5/2014 |
| KR | 10-2015-0057753 A | 5/2015 |
| KR | 10-2018-0025427 A | 3/2018 |
| KR | 10-2018-0061720 A | 6/2018 |
| KR | 10-2018-0061723 A | 6/2018 |
| KR | 10-2018-0137640 A | 12/2018 |

* cited by examiner

ORGANIC LIGHT EMITTING DISPLAY DEVICE

CROSS-REFERENCE TO RELATED APPLICATIONS

This application claims priority to and the benefit of Korean Patent Application No. 10-2019-0003177, filed on Jan. 10, 2019, and PCT Application No PCT/KR2019/002603, filed on Mar. 6, 2019, the entire contents of which are incorporated herein by reference.

BACKGROUND

1. Field

Embodiments relate generally to an organic light emitting display device. More particularly, embodiments of the present inventive concept relate to an organic light emitting display device including different types of transistors to each other.

2. Description of the Related Art

Hat panel display devices are used as display devices for replacing a cathode ray tube display device due to lightweight and thin characteristics thereof. A liquid crystal display device and an organic light emitting display device are representative examples of the flat panel display devices.

Recently, an organic light emitting display device including a silicon-based semiconductor element and a metal oxide-based semiconductor element has been developed. In order to drive the organic light emitting display device with a high resolution, the organic light emitting display device may include a relatively large number of signal wires. When the organic light emitting display device includes the relatively large number of signal wires, a width of the signal wires may be relatively reduced to arrange the signal wires in a limited space, and a resistance of the signal wires may be increased. In addition, two data wires may be included in the sub-pixel circuit in order to drive the organic light emitting display device at high speed. When the sub-pixel circuit includes two data wires, a characteristic of a driving transistor disposed adjacent to the data wires may be changed due to a variable voltage level of the data wires.

SUMMARY

An object of a present inventive concept is to provide an organic light emitting display device including different types of transistors to each other.

However, the object of the present inventive concept is not limited thereto. Thus, the object of the present inventive concept may be extended without departing from the spirit and the scope of the present inventive concept.

In order to achieve the object of the present inventive concept described above, an organic light emitting display device according to the embodiments of the present inventive concept includes a substrate including a light emitting region, a first active layer having a source region and a drain region disposed in the light emitting region on the substrate, a gate insulation layer disposed on the first active layer, a first gate electrode disposed on the gate insulation layer, a first insulating interlayer disposed on the first gate electrode, a second insulating interlayer disposed on the first insulating interlayer, a first source electrode disposed on the second insulating interlayer, the first source electrode being connected to the source region of the first active layer through a contact hole formed in the gate insulation layer, the first insulating interlayer, and the second insulating interlayer, a protective insulating layer disposed on the first source electrode, a first drain electrode disposed on the protective insulating layer, the first drain electrode being connected to the drain region of the first active layer through a contact hole formed in the gate insulation layer, the first insulating interlayer, the second insulating interlayer, and the protective insulating layer, the first drain electrode constituting a driving transistor together with the first active layer, the first gate electrode, and the first source electrode, a switching transistor disposed in the second region between the substrate and the protective insulating layer, a lower electrode disposed on the switching transistor and the driving transistor, a light emitting layer disposed on the lower electrode, and an upper electrode disposed on the light emitting layer.

In embodiments, the first drain electrode may extend toward the first source electrode.

In embodiments, a part of the first drain electrode may overlap the first source electrode.

In embodiments, a part of the first drain electrode may overlap the first gate electrode.

In embodiments, the first source electrode may include a single layer, and the first drain electrode may include a plurality of layers.

In embodiments, the first source electrode may include molybdenum, and the first drain electrode may include titanium, aluminium and titanium which are sequentially stacked.

In embodiments, the organic light emitting display device may further include a signal wire disposed on the first drain electrode.

In embodiments, a data signal may be applied to the signal wire and a high power supply voltage may be applied to the first drain electrode. A low power supply voltage may be applied to the upper electrode.

In embodiments, the switching transistor may include a second gate electrode, a second active layer disposed on the second gate electrode, and a second source electrode and a second drain electrode disposed in both lateral portions of the second active layer.

In embodiments, the first drain electrode may not overlap the second active layer.

In embodiments, the driving transistor may have a top gate structure and the first active layer may include a silicon-based semiconductor. The switching transistor may have a bottom gate structure, and the second active layer may include a metal oxide-based semiconductor.

In embodiments, the first active layer of the driving transistor may include amorphous silicon or poly silicon.

In embodiments, the organic light emitting display device may further include a gate electrode pattern disposed on the first gate electrode.

In embodiments, the gate electrode pattern and the second gate electrode may be disposed on a same layer.

In embodiments, the substrate may include a first organic layer, a first bather layer disposed on the first organic layer, a second organic layer disposed on the first bather layer, and a second bather layer disposed on the second organic layer.

In embodiments, the substrate may further include a bending region spaced apart from the light emitting region. The second bather layer may have an opening exposing an upper surface of the second organic layer in an area corresponding to the bending region In embodiments, the substrate may include a first region in which the driving transistor is disposed, a second region in which the switching transistor is disposed and a bending region spaced apart from the light emitting region. The organic light emitting display device may further include a buffer layer disposed in the first region and the second region on the substrate, the buffer layer extending into the bending region, and the buffer layer having a first opening exposing an upper surface of the substrate disposed in an area corresponding to the bending region. The gate insulation layer may cover the first active layer in the first region on the buffer layer and extend into the bending region and may have a second opening overlapping the first opening. The first insulating layer may cover the first gate electrode in the first region on the gate insulation layer and extend into the bending region and may have a third opening overlapping the first opening and the second opening.

In embodiments, the organic light emitting display device may further include a thin film encapsulation structure disposed on the upper electrode. The thin film encapsulation structure may include a first thin film encapsulation layer including an inorganic material having a flexibility, a second thin film encapsulation layer disposed on the first thin film encapsulation layer, the second thin film encapsulation layer including an organic material having a flexibility, and a third thin film encapsulation layer disposed on the second thin film encapsulation layer, the third thin film encapsulation layer including an inorganic material having a flexibility.

In embodiments, the first source electrode may have a first thickness, and the first drain electrode may have a second thickness greater than the first thickness.

In order to achieve the object of the present inventive concept described above, an organic light emitting display device according to the embodiments of the present inventive concept includes a substrate including a bending region and a light emitting region, a driving transistor disposed in the light emitting region on the substrate, the driving transistor including, a first active layer having a source region and a drain region, a first gate electrode disposed on the first active layer, a first electrode disposed on the first gate electrode, the first electrode being connected to the source region of the first active layer through a first contact hole, the first electrode having a first thickness, and a second electrode disposed on the first electrode, the second electrode being connected to the drain region of the first active layer through a second contact hole, the second electrode having a second thickness greater than the first thickness, a switching transistor disposed in the second region on the substrate; and, a sub pixel structure disposed on the switching and driving transistors.

In embodiments, the second electrode has a width greater than that of the first electrode.

In embodiments, the second electrode may extend toward the first electrode to cover the first electrode and the first active layer in a plan view In embodiments, the second electrode may completely cover the first electrode along a width direction of the first electrode.

In embodiments, the organic light emitting display device may further include a sub-pixel structure connected to the first electrode.

In embodiments, the organic light emitting display device may further include a sub-pixel structure connected to the second electrode.

In order to achieve the object of the present inventive concept described above, an organic light emitting display device according to the embodiments of the present inventive concept includes a substrate including a light emitting region, a driving transistor disposed in the light emitting region on the substrate, the driving transistor including an active layer having a source region and a drain regions, a first gate electrode disposed to overlap the first active layer, a first electrode directly connected to the source region through a first contact hole, and a second electrode directly connected to the drain region through a second contact hole. The first electrode and the second electrode may be disposed on a different layer.

In embodiments, the second electrode may be disposed on the first electrode.

In embodiments, the second electrode may have a thickness greater than that of the first electrode.

In embodiments, the second electrode may have a width greater than that of the first electrode.

In embodiments, the second electrode may extend toward the first electrode to cover the first electrode and the first active layer in a plan view In embodiments, the second electrode may completely cover the first electrode along a width direction of the first electrode.

In embodiments, the first electrode may be disposed on the second electrode.

In embodiments, the first electrode may have a thickness greater than that of the second electrode.

In embodiments, the first electrode may have a width greater than that of the second electrode.

In embodiments, the first electrode may extend toward the second electrode to cover the second electrode and the first active layer in a plan view. the first electrode may completely cover the second electrode along a width direction of the second electrode.

As the organic light emitting display device according to embodiments of the present inventive concept includes the driving transistor including the first drain electrode and the first source electrode that are disposed on different layers to each other, the first drain electrode may function as a wire having a relatively large width and a relatively large thickness. Accordingly, the organic light emitting display device may be driven with a high resolution.

In addition, as the organic light emitting display device according to embodiments of the present inventive concept includes the first drain electrode that shields the first active layer, a parasitic capacitance may not be formed between the signal wire and the driving transistor. Accordingly, the organic light emitting display device may maintain characteristics of the driving transistor.

However, the effects of the present inventive concept are not limited thereto. Thus, the effects of the present inventive concept may be extended without departing from the spirit and the scope of the present inventive concept.

DETAILED DESCRIPTION OF THE INVENTIVE CONCEPT

Figure 1:
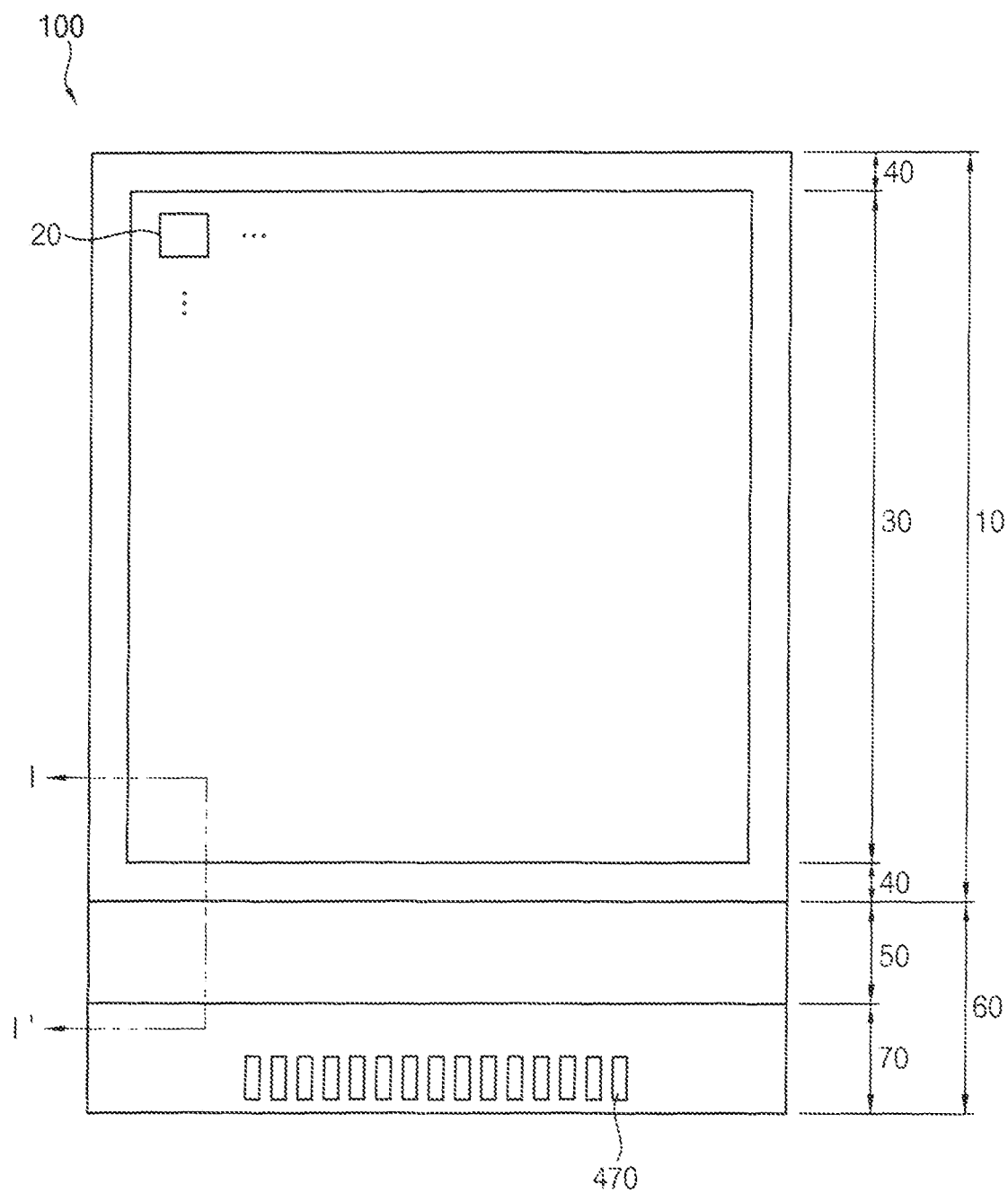
FIG. 1 is a plan view showing an organic light emitting display device according to embodiments of a present inventive concept.
Figure 1:
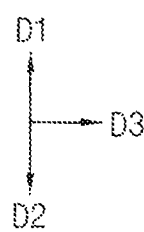

Hereinafter, an organic light emitting display device according to embodiments of a present inventive concept and a method of manufacturing an organic light emitting display device according to embodiments of a present inventive concept will be explained in detail with reference to the accompanying drawings. In the accompanying drawings, the same or similar reference numerals are used for the same or similar components.

Figure 2:
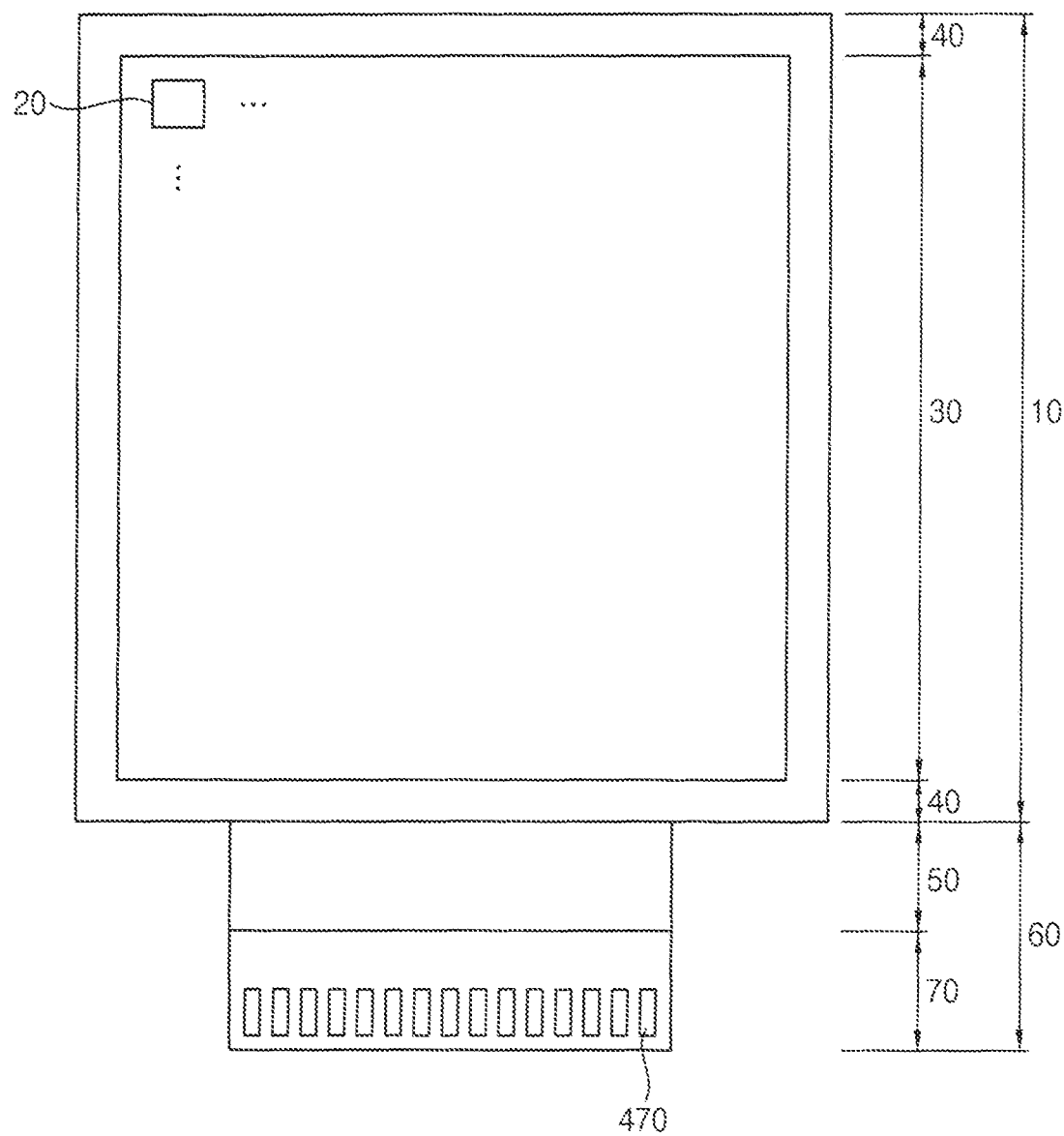
FIG. 2 is a plan view showing an example of the organic light emitting display device of FIG. 1.
Figure 3:
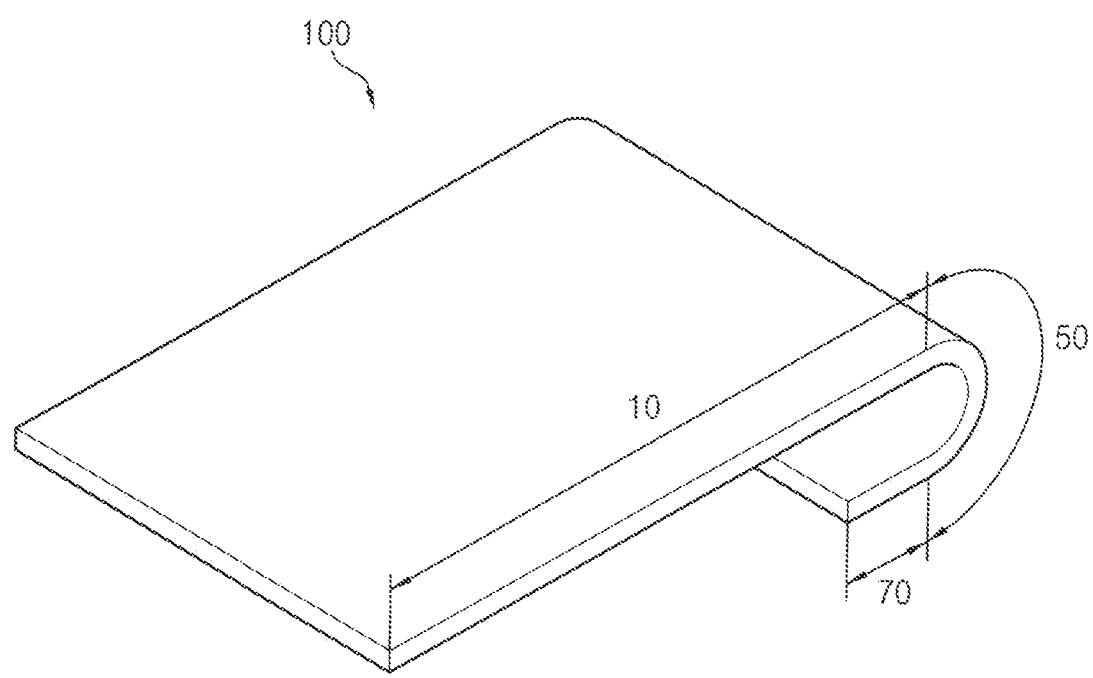
FIG. 3 is a perspective view showing a shape where the organic light emitting display device of FIG. 1 is bent.
Figure 3:

FIG. 1 is a plan view showing an organic light emitting display device according to embodiments of a present inventive concept, and FIG. 2 is a plan view showing an example of the organic light emitting display device of FIG. 1. FIG. 3 is a perspective view showing a shape where the organic light emitting display device of FIG. 1 is bent, and FIG. 4 is a block diagram showing an external device that is electrically connected to the organic light emitting display device of FIG. 1.

Figure 4:
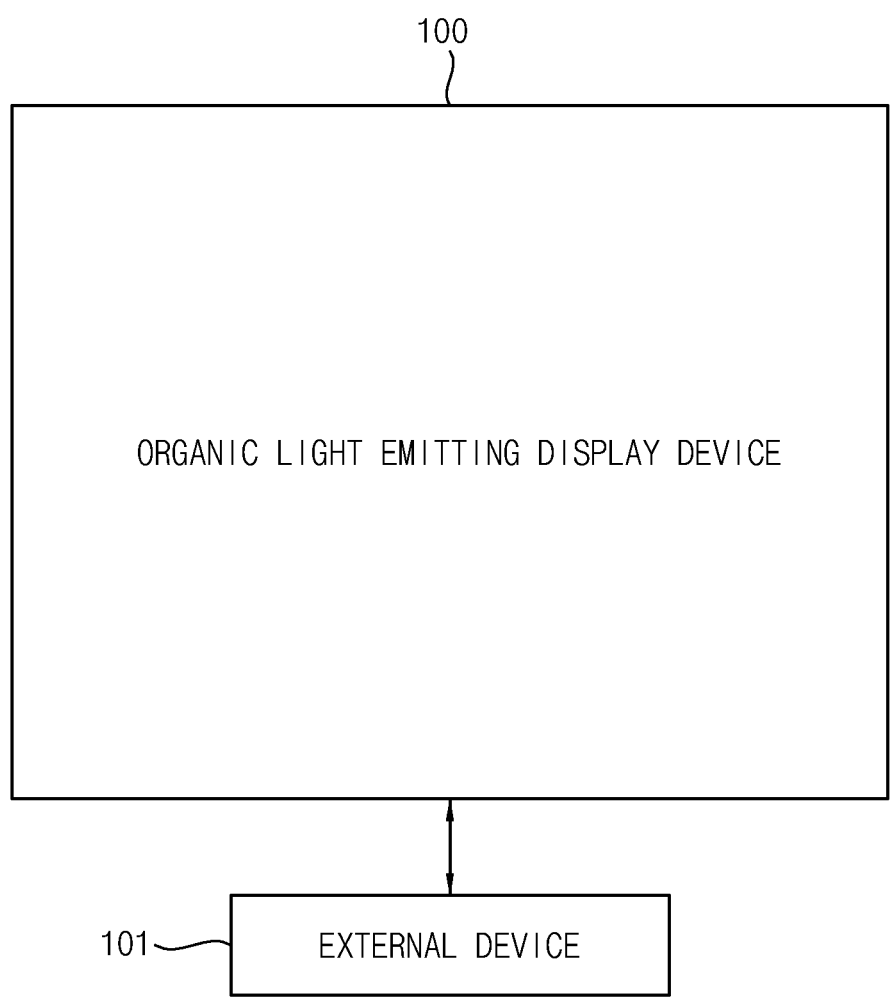
FIG. 4 is a block diagram showing an external device that is electrically connected to the organic light emitting display device of FIG. 1.

Referring to FIGS. 1, 3, and 4, an organic light emitting display device 100 (e.g., substrate 110 of FIG. 6) may include a display region 10 and a pad region 60. The display region 10 may include a light emitting region 30 including a plurality of sub-pixel circuit regions 20 and a peripheral region 40 surrounding the light emitting region 30, and the sub-pixel circuit regions 20 may be entirely arranged in the light emitting region 30. For example, a sub-pixel circuit SPC of FIG. 5 (e.g., a driving transistor 250 of FIG. 6 and a switching transistor 255 of FIG. 6) may be disposed in each of the sub-pixel circuit regions 20, and an organic light emitting diode OLED of FIG. 5 (e.g., a sub-pixel structure 200 of FIG. 6) may be disposed on the sub-pixel circuit SPC. An image may be displayed in the display region 10 through the sub-pixel circuit SPC and the organic light emitting diode OLED.

For example, first, second, and third sub-pixel circuits may be disposed in the sub-pixel circuit regions 20. The first sub-pixel circuit may be connected to a first organic light emitting diode for emitting red light, the second sub-pixel circuit may be connected to a second organic light emitting diode for emitting green light, and the third sub-pixel circuit may be connected to a third organic light emitting diode for emitting blue light.

In embodiments, the first organic light emitting diode may be overlapped with the first sub-pixel circuit, and the second organic light emitting diode may be overlapped with the second sub-pixel circuit. In addition, the third organic light emitting diode may be overlapped with the third sub-pixel circuit. Alternatively, the first organic light emitting diode may be overlapped with a part of the first sub-pixel circuit and a part of sub-pixel circuit other than the first sub-pixel circuit, and the second organic light emitting diode may be overlapped with a part of the second sub-pixel circuit and a part of sub-pixel circuit other than the second sub-pixel circuit. In addition, the third organic light emitting diode may be overlapped with a part of the third sub-pixel circuit and a part of sub-pixel circuit other than the third sub-pixel circuit. For example, the first to third organic light emitting diodes may be arranged in an RGB stripe scheme in which rectangles having an identical size are arranged in order, an S-stripe scheme including a blue organic light emitting diode having a relatively large area, a WRGB scheme further including a white organic light emitting diode, a PenTile scheme in which RG-GB patterns are repeatedly arranged, etc.

In addition, at least one driving transistor, at least one switching transistor, at least one capacitor, and the like may be disposed in each of the sub-pixel circuit regions 20. In embodiments, one driving transistor (e.g., a first transistor TR1 of FIG. 5) and six switching transistors (e.g., second to seventh transistors TR2, TR3, TR4, TR5, TR6, and TR7 of FIG. 5), one storage capacitor (e.g., a storage capacitor CST of FIG. 5), and the like may be disposed in each of the sub-pixel circuit regions 20.

Although each of the display region 10, the peripheral region 40, and the sub-pixel circuit region 20 of the present inventive concept has been described as having a rectangular planar shape, but the shape is not limited thereto. For example, each of the display region 10, the peripheral region 40, and the sub-pixel circuit region 20 may have a triangular planar shape, a rhombic planar shape, a polygonal planar shape, a circular planar shape, a track planar shape, or an elliptical planar shape.

Moreover, a plurality of wires may be disposed in the peripheral region 40. For example, the wires may include a data signal wire, a gate signal wire, a light emission control signal wire, a gate initialization signal wire, an initialization voltage wire, a power supply voltage wire, etc. The wires may extend from the peripheral region 40 to the light emitting region 30 and may be electrically connected to the sub-pixel circuit and the organic light emitting diode. Further, a gate driver, a data driver, and the like may be disposed in the peripheral region 40.

The pad region 60 may be disposed on one side of the display region 10, and the pad region 60 may include a bending region 50 and a pad electrode region 70. Pad electrodes 470 electrically connected to an external device 101 may be disposed in the pad electrode region 70. In addition, the bending region 50 may be disposed between the display region 10 and the pad electrode region 70, and connection electrodes may be disposed in the bending region 50. For example, the connection electrodes may electrically connect the pad electrodes 470 and the sub-pixel circuit. In embodiments, the organic light emitting display device 100 may have a uniform width in the horizontal direction (e.g., a third direction D3).

In other embodiments, as illustrated in FIG. 2, a width of the pad region 60 may be less than a width of the display region 10. For example, the display region 10 may have a first width extending in a direction (e.g., the third direction D3) that is parallel to an upper surface of the organic light emitting display device 100 in a plan view of the organic light emitting display device 100, and the pad region 60 may have a second width, which is less than the first width, extending in the third direction D3.

Although the peripheral region 40 surrounding the light emitting region 30 is shown in FIG. 1 as having an identical width, but the configuration of the present inventive concept is not limited thereto. For example, the peripheral region 40 may include a first peripheral region extending in the third direction D3 and a second peripheral region extending in first or second directions D1 or D2 that are perpendicular to the third direction D3. In other words, the first peripheral region of the peripheral region 40 may be adjacent to a top of the light emitting region 30 and the bending region 50, and the second peripheral region of the peripheral region 40 may be located on both lateral portions of the light emitting region 30 (e.g., left and right portions of light emitting region 30). Here, a width extending in the third direction D3 of the second peripheral region may be relatively less than a width extending in the first or second directions D1 or D2 of the first peripheral region. As the bending region 50 is bent on an axis with the third direction D3, the pad electrode region 70 may be disposed on a lower surface of the organic light emitting display device 100 (refer to FIG. 3). In other words, when the pad electrode region 70 is disposed on the lower surface of the organic light emitting display device 100, the bending region 50 may have a bent shape as disclosed in FIG. 3.

The external device 101 may be electrically connected to the organic light emitting display device 100 through a flexible printed circuit board or a printed circuit board. For example, one side of the flexible printed circuit board may be in direct contact with the pad electrodes 470, and an opposite side of the flexible printed circuit board may be in direct contact with the external device 101. The external device 101 may provide a data signal, a gate signal, a light emission control signal, a gate initialization signal, an initialization voltage, a power supply voltage, and the like to the organic light emitting display device 100. In addition, a driver integrated circuit may be mounted on the flexible printed circuit board. In other embodiments, the driver integrated circuit may be mounted on the organic light emitting display device 100 adjacent to the pad electrodes 470.

Figure 5:
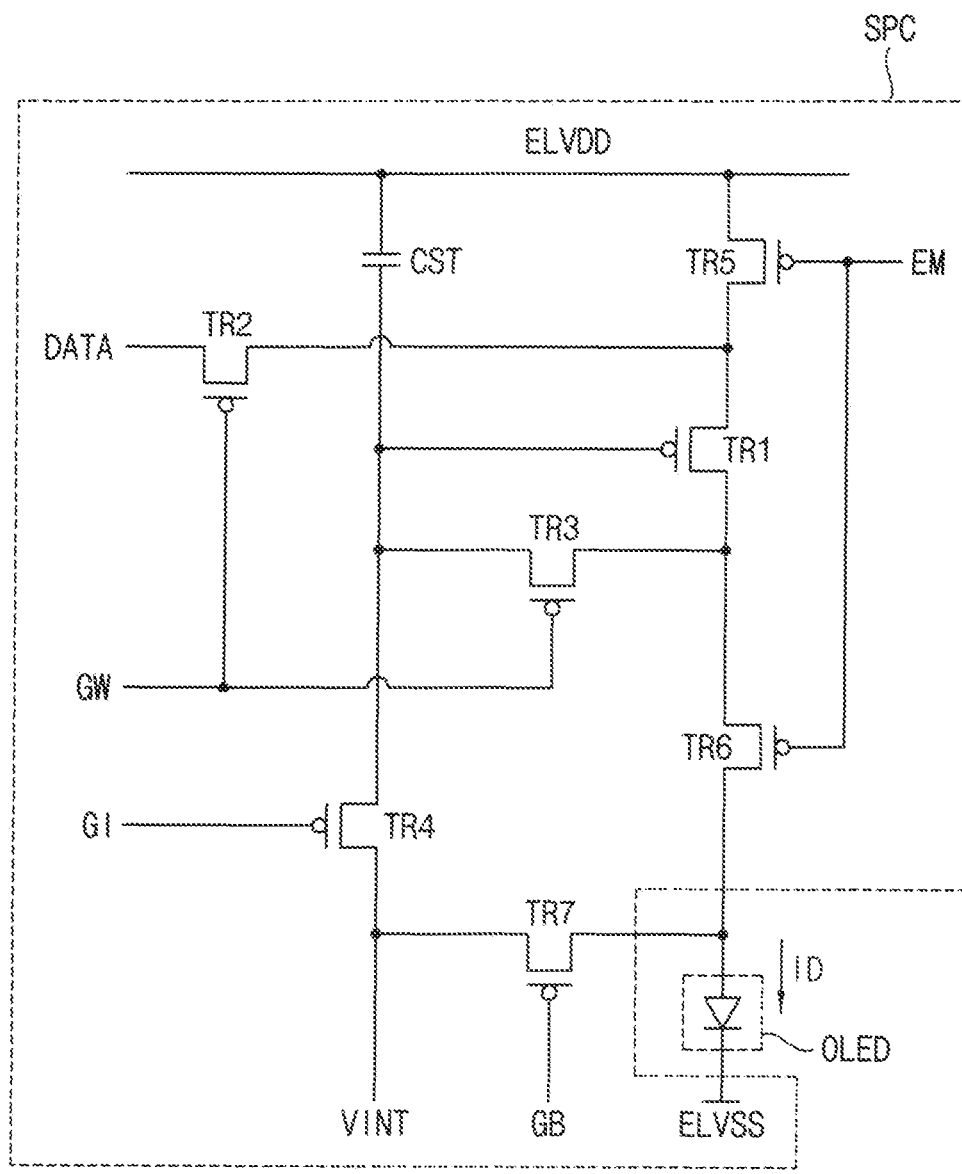
FIG. 5 is a circuit diagram showing a sub-pixel circuit and an organic light emitting diode which are disposed in a sub-pixel region of FIG. 1.

FIG. 5 is a circuit diagram showing a sub-pixel circuit and an organic light emitting diode which are disposed in a sub-pixel region of FIG. 1.

Referring to FIG. 5, a sub-pixel circuit SPC and an organic light emitting diode OLED (e.g., a sub-pixel structure 200 of FIG. 6) may be disposed in each of a sub-pixel circuit regions 20 of the organic light emitting display device 100, and one sub-pixel circuit SPC may include first to seventh transistors TR1, TR2, TR3, TR4, TR5, TR6, and TR7, a storage capacitor CST, a wire for a high power supply voltage ELVDD, a wire for a low power supply voltage ELVSS, a wire for an initialization voltage VINT, a wire for a data signal DATA, a wire for a gate signal GW, a wire for a gate initialization signal GI, a wire for a light emission control signal EM, a wire for a diode initialization signal GB, etc.

The organic light emitting diode OLED may output light based on a driving current ID. The organic light emitting diode OLED may include a first terminal and a second terminal. In embodiments, the second terminal of the organic light emitting diode OLED may be supplied with the low power supply voltage ELVSS. For example, the first terminal of the organic light emitting diode OLED may be an anode terminal, and the second terminal of the organic light emitting diode OLED may be a cathode terminal. Alternatively, the first terminal of the organic light emitting diode OLED may be the cathode terminal, and the second terminal of the organic light emitting diode OLED may be the anode terminal. In embodiments, the anode terminal of the organic light emitting diode OLED may correspond to a lower electrode 290 of FIG. 6, and the cathode terminal of the organic light emitting diode OLED may correspond to an upper electrode 340 of FIG. 6.

The first transistor TR1 (e.g., corresponding to driving transistor 250 of FIG. 6) may include a gate terminal, a first terminal, and a second terminal. In embodiments, the first terminal of the first transistor TR1 may be a source terminal and the second terminal of the first transistor TR1 may be a drain terminal.

The first transistor TR1 may generate the driving current ID. In embodiments, the first transistor TR1 may operate in a saturation region. In this case, the first transistor TR1 may generate the driving current ID based on a voltage difference between the gate terminal and the source terminal. In addition, a gradation may be expressed based on a magnitude of the driving current ID supplied to the organic light emitting diode OLED. Alternatively, the first transistor TR1 may operate in a linear region. In this case, the gradation may be expressed based on the sum of times during which the driving current is supplied to the organic light emitting diode OLED within one frame.

The second transistor TR2 may include a gate terminal, a first terminal, and a second terminal. The gate terminal of the second transistor TR2 may be supplied with the gate signal GW. The first terminal of the second transistor TR2 may be supplied with the data signal DATA. The second terminal of the second transistor TR2 may be connected to the first terminal of the first transistor TR1. For example, the gate signal GW may be provided from a gate driver and the gate signal GW may be applied to the gate terminal of the second transistor TR2 through the wire for the gate signal GW. In embodiments, the first terminal of the second transistor TR2 may be a source terminal, and the second terminal of the second transistor TR2 may be a drain terminal. Alternatively, the first terminal of the second transistor TR2 may be the drain terminal, and the second terminal of the second transistor TR2 may be the source terminal.

The second transistor TR2 may supply the data signal DATA to the first terminal of the first transistor TR1 during an activation period of the gate signal GW. In this case, the second transistor TR2 may operate in a linear region.

The third transistor TR3 may include a gate terminal, a first terminal, and a second terminal. The gate terminal of the third transistor TR3 may be supplied with the gate signal GW. The first terminal of the third transistor TR3 may be connected to the gate terminal of the first transistor TR1. The second terminal of the third transistor TR3 may be connected to the second terminal of the first transistor TR1. For example, the gate signal GW may be provided from the gate driver and the gate signal GW may be applied to the gate terminal of the third transistor TR3 through the wire for the gate signal GW. In embodiments, the first terminal of the third transistor TR3 may be a source terminal and the second terminal of the third transistor TR3 may be a drain terminal. Alternatively, the first terminal of the third transistor TR3 may be the drain terminal and the second terminal of the third transistor TR3 may be the source terminal.

The third transistor TR3 may connect the gate terminal of the first transistor TR1 to the second terminal of the first transistor TR1 during the activation period of the gate signal GW. In this case, the third transistor TR3 may operate in a linear region. That is, the third transistor TR3 may diode-connect the first transistor TR1 during the activation period of the gate signal GW. Since the first transistor TR1 is diode-connected, a voltage difference between the first terminal of the first transistor TR1 and the gate terminal of the first transistor TR1 may be as much as a threshold voltage of the first transistor TR1. As a result, a voltage obtained by adding the voltage difference (i.e., the threshold voltage) to a voltage of the data signal DATA supplied to the first terminal of the first transistor TR1 may be supplied to the gate terminal of the first transistor TR1 during the activation period of the gate signal GW. That is, the data signal DATA may be compensated as much as the threshold voltage of the first transistor TR1, and the compensated data signal DATA may be supplied to the gate terminal of the first transistor TR1. As the threshold voltage compensation is performed, a problem of a non-uniform driving current caused by a threshold voltage deviation of the first transistor TR1 may be solved.

The wire for the initialization voltage VINT provided with the initialization voltage VINT may be connected to a first terminal of the fourth transistor TR4 and a first terminal of the seventh transistor TR7.

The fourth transistor TR4 may include a gate terminal, a first terminal, and a second terminal. The gate terminal of the fourth transistor TR4 may be supplied with the gate initialization signal GI. The first terminal of the fourth transistor TR4 may be supplied with the initialization voltage VINT. The second terminal of the fourth transistor TR4 may be connected to the gate terminal of the first transistor TR1. In embodiments, the first terminal of the fourth transistor TR4 may be a source terminal and the second terminal of the fourth transistor TR4 may be a drain terminal. Alternatively, the first terminal of the fourth transistor TR4 may be the drain terminal and the second terminal of the fourth transistor TR4 may be the source terminal.

The fourth transistor TR4 may supply the initialization voltage VINT to the gate terminal of the first transistor TR1 during an activation period of the gate initialization signal GI. In this case, the fourth transistor TR4 may operate in a linear region. That is, the fourth transistor TR4 may initialize the gate terminal of the first transistor TR1 to the initialization voltage VINT during the activation period of the gate initialization signal GI. In embodiments, the initialization voltage VINT may have a voltage level sufficiently lower than a voltage level of the data signal DATA maintained by the storage capacitor CST in a previous frame and the initialization voltage VINT may be supplied to the gate terminal of the first transistor TR1. In other embodiments, the initialization voltage may have a voltage level sufficiently higher than the voltage level of the data signal maintained by the storage capacitor in the previous frame and the initialization voltage may be supplied to the gate terminal of the first transistor TR1.

In embodiments, the gate initialization signal GI may be a signal substantially identical to the gate signal GW of a previous pixel row. For example, the gate initialization signal GI supplied to a sub-pixel circuit in an nth row (where n is an integer of 2 or more) among the sub-pixel circuits included in the organic light emitting display device 100 may be a signal substantially identical to the gate signal GW supplied to a sub-pixel circuit in an (n−1)th row among the sub-pixel circuits. That is, an activated gate initialization signal GI may be supplied to a first sub-pixel circuit in the nth row among the sub-pixel circuits SPC by supplying an activated gate signal GW of the previous pixel row. As a result, the data signal DATA may be supplied to the sub-pixel circuit in the (n−1)th row among the sub-pixel circuits SPC while the gate terminal of the first transistor TR1 included in the sub-pixel circuit in the nth row among the sub-pixel circuits SPC are initialized to the initialization voltage VINT.

The fifth transistor TR5 may include a gate terminal, a first terminal, and a second terminal. The gate terminal may be supplied with the light emission control signal EM. The first terminal may be connected to the wire for the high power supply voltage ELVDD. The second terminal may be connected to the first terminal of the first transistor TR1. For example, the light emission control signal EM may be provided from a light emission control driver and the light emission control signal EM may be applied to the gate terminal of the fifth transistor TR5 through the wire for the light emission control signal EM. In embodiments, the first terminal of the fifth transistor TR5 may be a source terminal and the second terminal of the fifth transistor TR5 may be a drain terminal. Alternatively, the first terminal of the fifth transistor TR5 may be the drain terminal and the second terminal of the fifth transistor TR5 may be the source terminal.

The fifth transistor TR5 may supply the high power supply voltage ELVDD to the first terminal of the first transistor TR1 during an activation period of the light emission control signal EM. On the contrary, the fifth transistor TR5 may shut off the supply of the high power supply voltage ELVDD during a deactivation period of the light emission control signal EM. In this case, the fifth transistor TR5 may operate in a linear region. The fifth transistor TR5 supplies the high power supply voltage ELVDD to the first terminal of the first transistor TR1 during the activation period of the light emission control signal EM so that the first transistor TR1 may generate the driving current ID. In addition, the fifth transistor TR5 shuts off the supply of the high power supply voltage ELVDD during the deactivation period of the light emission control signal EM so that the data signal DATA supplied to the first terminal of the first transistor TR1 may be supplied to the gate terminal of the first transistor TR1.

The sixth transistor TR6 may include a gate terminal, a first terminal, and a second terminal. The gate terminal may be supplied with the light emission control signal EM. The first terminal may be connected to the second terminal of the first transistor TR1. The second terminal may be connected to the first terminal of the organic light emitting diode OLED. In embodiments, the first terminal of the sixth transistor TR6 may be a source terminal and the second terminal of the sixth transistor TR6 may be a drain terminal. Alternatively, the first terminal of the sixth transistor TR6 may be the drain terminal and the second terminal of the sixth transistor TR6 may be the source terminal.

The sixth transistor TR6 may supply the driving current ID generated by the first transistor TR1 to the organic light emitting diode OLED during the activation period of the light emission control signal EM. In this case, the sixth transistor TR6 may operate in a linear region. That is, the sixth transistor TR6 supplies the driving current ID generated by the first transistor TR1 to the organic light emitting diode OLED during the activation period of the light emission control signal EM so that the organic light emitting diode OLED may output light. In addition, the sixth transistor TR6 electrically separates the first transistor TR1 from the organic light emitting diode OLED during the deactivation period of the light emission control signal EM so that the data signal DATA supplied to the second terminal of the first transistor TR1 (more precisely, a threshold voltage compensated data signal) may be supplied to the gate terminal of the first transistor TR1.

The seventh transistor TR7 may include a gate terminal, a first terminal, and a second terminal. The gate terminal may be supplied with the diode initialization signal GB. The first terminal may be supplied with the initialization voltage VINT. The second terminal may be connected to the first terminal of the organic light emitting diode OLED. In embodiments, the first terminal of the seventh transistor TR7 may be a source terminal and the second terminal of the seventh transistor TR7 may be a drain terminal. Alternatively, the first terminal of the seventh transistor TR7 may be the drain terminal and the second terminal of the seventh transistor TR7 may be the source terminal.

The seventh transistor TR7 may supply the initialization voltage VINT to the first terminal of the organic light emitting diode OLED during an activation period of the diode initialization signal GB. In this case, the seventh transistor TR7 may operate in the linear region. That is, the seventh transistor TR7 may initialize the first terminal of the organic light emitting diode OLED to the initialization voltage VINT during the activation period of the diode initialization signal GB.

Alternatively, the gate initialization signal GI and the diode initialization signal GB may be signals substantially identical to each other. An operation of initializing the gate terminal of the first transistor TR1 and an operation of initializing the first terminal of the organic light emitting diode OLED may not affect each other. That is, the operation of initializing the gate terminal of the first transistor TR1 and the operation of initializing the first terminal of the organic light emitting diode OLED may be independent of each other. Accordingly, the diode initialization signal GB is not separately generated so that a process can be simplified.

The storage capacitor CST may include a first terminal and a second terminal. The storage capacitor CST may be connected between the wire for the high power supply voltage ELVDD and the gate terminal of the first transistor TR1. For example, the first terminal of the storage capacitor CST may be connected to the gate terminal of the first transistor TR1 and the second terminal of the storage capacitor CST may be connected to the wire for the high power supply voltage ELVDD. The storage capacitor CST may maintain a voltage level of the gate terminal of the first transistor TR1 during a deactivation period of the gate signal GW. The deactivation period of the gate signal GW may include the activation period of the light emission control signal EM and the driving current ID generated by the first transistor TR1 may be supplied to the organic light emitting diode OLED during the activation period of the light emission control signal EM. Therefore, the driving current ID generated by the first transistor TR1 may be supplied to the organic light emitting diode OLED based on the voltage level maintained by the storage capacitor CST.

Although the sub-pixel circuit SPC of the present inventive concept has been described as including the seven transistors and the one storage capacitor, the configuration of the present inventive concept is not limited thereto. For example, the sub-pixel circuit SPC may have a configuration including at least one transistor and at least one storage capacitor.

Figure 6:
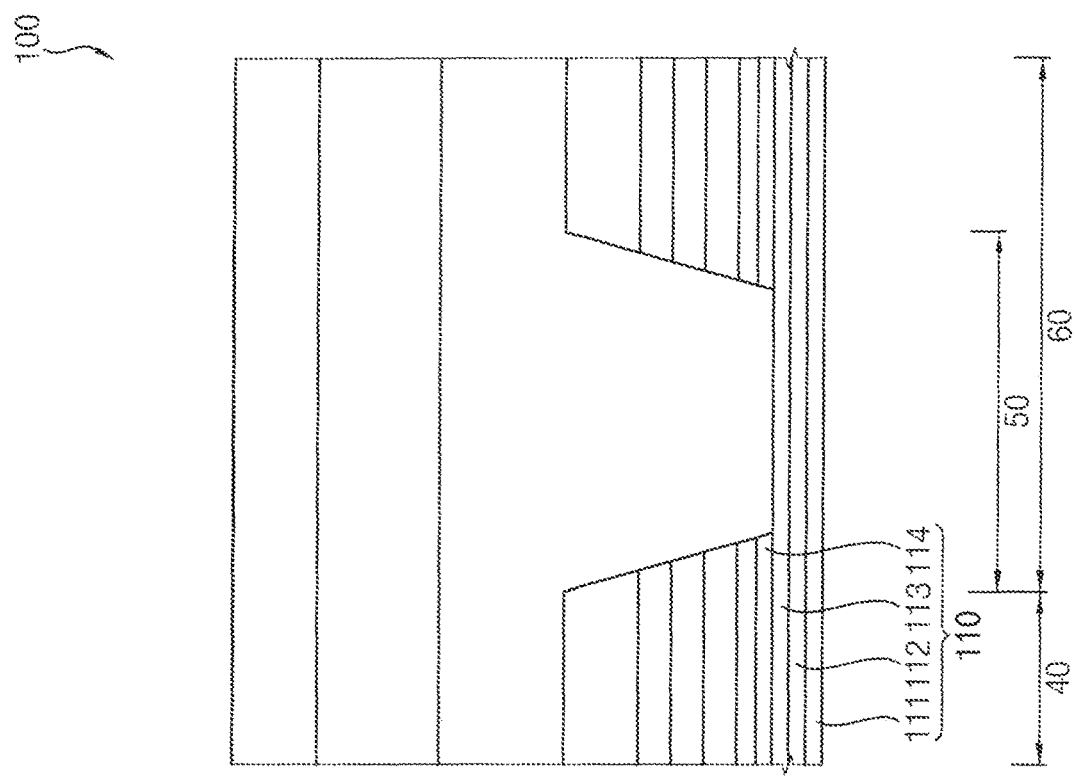
FIG. 6 is a cross-sectional view taken along line I-I' of the organic light emitting display device of FIG. 1.
Figure 6:
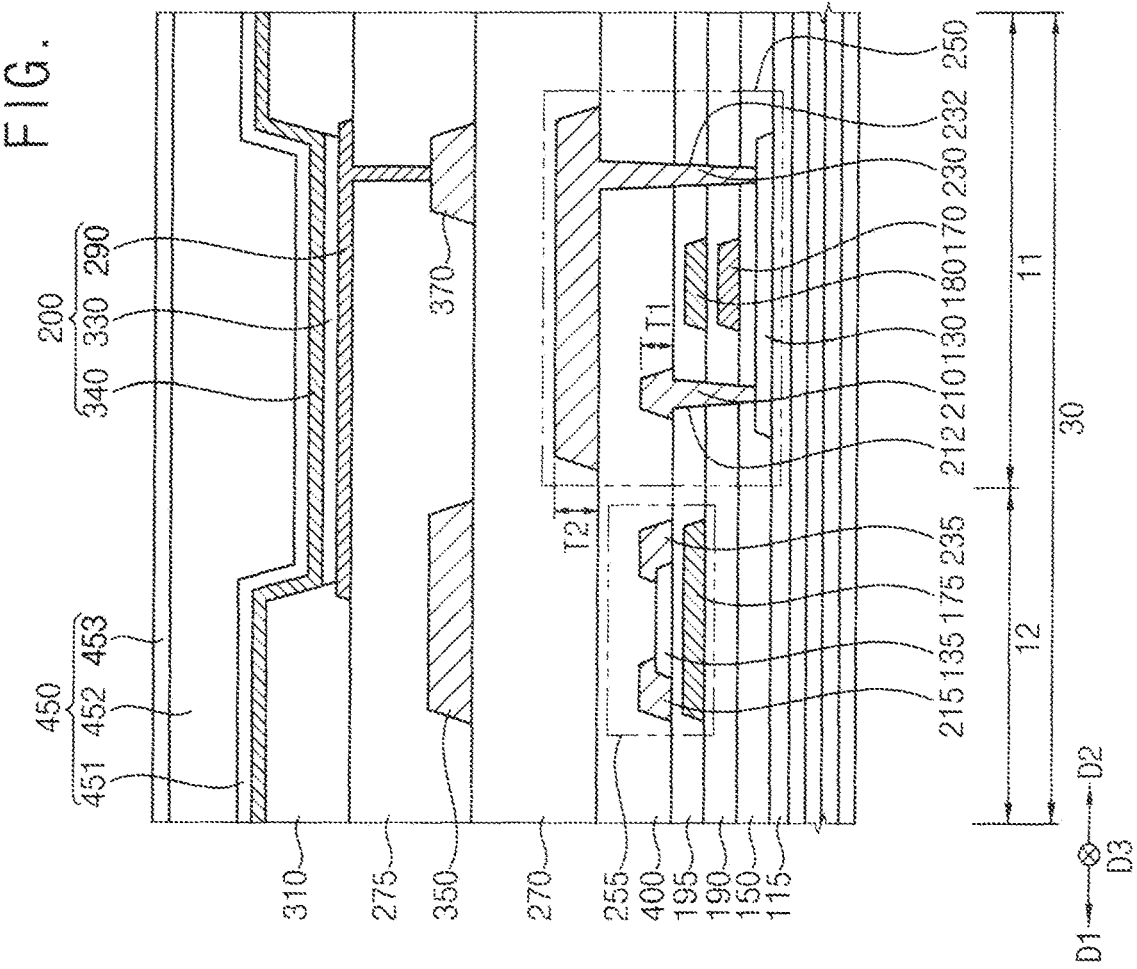

FIG. 6 is a cross-sectional view taken along line I-I' of the organic light emitting display device of FIG. 1.

Referring to FIG. 6, the organic light emitting display device 100 may include a substrate 110, a buffer layer 115, a driving transistor 250, a switching transistor 255, a gate electrode pattern 180, a gate insulation layer 150, a first insulating interlayer 190, a second insulating interlayer 195, a protective insulating layer 400, a first planarization layer 270, a signal wire 350, a connection pattern 370, a second planarization layer 275, a sub-pixel structure 200, a pixel defining layer 310, a thin film encapsulation structure 450, etc. Here, the substrate 110 may include a first organic layer 111, a first bather layer 112, a second organic layer 113, and a second bather layer 114. Since the organic light emitting display device 100 includes the display region 10 which includes the light emitting region 30 and the peripheral region 40, and the pad region 60 which includes the bending region 50 and the pad electrode region 70. The substrate 110 may also be divided into the display region 10 and the pad region 60. In addition, the driving transistor 250 may include a first active layer 130, a first gate electrode 170, a first source electrode 210, and a first drain electrode 230. The switching transistor 255 may include a second active layer 135, a second gate electrode 175, a second source electrode 215, and a second drain electrode 235. Furthermore, the sub-pixel structure 200 may include a lower electrode 290, a light emitting layer 330, and an upper electrode 340. The thin film encapsulation structure 450 may include a first thin film encapsulation layer 451, a second thin film encapsulation layer 452, and a third thin film encapsulation layer 453.

Since the organic light emitting display device 100 includes a flexible substrate 110 and the thin film encapsulation structure 450, the organic light emitting display device 100 may function as a flexible organic light emitting display device.

The first organic layer 111 may be provided. The first organic layer 111 may include a flexible organic material. In embodiments, the first organic layer 111 may include polyimide, etc.

The first bather layer 112 may be disposed on the first organic layer 111. The first bather layer 112 may block moisture penetrating through the first organic layer 111. The first bather layer 112 may include a flexible inorganic material. In embodiments, the first bather layer 112 may include silicon oxide, silicon nitride, etc.

The second organic layer 113 may be disposed on the first bather layer 112. The second organic layer 113 may be disposed on the entire first bather layer 112. The second organic layer 113 may include a flexible organic material. In embodiments, the second organic layer 115 may include polyimide, etc.

The second bather layer 114 may be disposed on the second organic layer 113. In embodiments, the second bather layer 114 may have an opening exposing an upper surface of the second organic layer 113 located in the bending region 50.

The second bather layer 114 may block moisture penetrating through the second organic layer 113. The second bather layer 114 may include a flexible inorganic material. In embodiments, the second bather layer 114 may include silicon oxide, silicon nitride, etc. Alternatively, an opening is not formed in the second bather layer 114 located in the bending region 50, or an opening is formed in the second organic layer 113 and the second bather layer 114 that are located in the bending region 50.

Accordingly, the substrate 110 including the first organic layer 111, the first bather layer 112, the second organic layer 113, and the second bather layer 114 may be embodied. In embodiments, the substrate 110 may have a first region 11 and a second region 12. The first region 11 may be disposed adjacent to the second region 12. For example, the first region 11 may be a region where the driving transistor is disposed, and the second region 12 may be a region where the switching transistor is disposed. In embodiments, as the opening is formed in layers corresponding to the bending region 50, the substrate 110 may have a groove in the bending region 50.

Although the substrate 110 is described as having four layers, but the configuration of the present inventive concept is not limited thereto. For example, in other embodiments, the substrate 110 may include a single layer or at least two layers.

In other embodiments, the substrate 110 may include a transparent or opaque material. For example, the substrate 110 may include a quartz substrate, a synthetic quartz substrate, a calcium fluoride substrate, a fluorine-doped quartz substrate (F-doped quartz substrate), a soda lime glass substrate, a non-alkali glass substrates, etc.

The buffer layer 115 may be disposed on the substrate 110. In embodiments, the buffer layer 115 may be disposed in the first region 11 and the second region 12 on the substrate 110 and extend into the bending region 50 and may have a first opening exposing the substrate 110 (e.g., the upper surface of the second organic layer 113) located in the bending region 50. The buffer layer 115 may prevent metal atoms or impurities from being diffused from the substrate 110 into the driving transistor 250, the switching transistor 255, and the sub-pixel structure 200, and may control a heat transfer rate during a crystallization process for forming the first active layer 130 to obtain a substantially uniform first active layer 130. In addition, the buffer layer 115 may serve to improve flatness of a surface of the substrate 110 when the surface of the substrate 110 is not uniform. Depending on a type of the substrate 110, at least two buffer layers 115 may be provided on the substrate 110, or the buffer layer 115 may not be provided on the substrate 110. For example, the buffer layer 115 may include an organic material or an inorganic material.

The first active layer 130 may be disposed in the first region 11 on the buffer layer 115. For example, the first active layer 130 may include a metal oxide semiconductor, amorphous silicon, polysilicon, an organic semiconductor, etc. In embodiments, the first active layer 130 may include a silicon-based semiconductor and may be formed of the amorphous silicon or the polysilicon. In embodiments, the first active layer 130 may have a source region, a drain region and a channel region.

The gate insulation layer 150 may be disposed in the first region 11 and the second region 12 on the buffer layer 115 and the first active layer 130. In embodiments, the gate insulation layer 150 may cover the first active layer 130 in the first region 11 on the substrate 110 and extend into the bending region 50 and may have a second opening overlapping the first opening. For example, the gate insulation layer 150 may sufficiently cover the first active layer 130 on the buffer layer 115 and may have a substantially flat surface without creating a step around the first active layer 130. Alternatively, the gate insulation layer 150 may cover the first active layer 130 on the buffer layer 115 and may be disposed to have a substantially uniform thickness along a profile of the first active layer 130. The gate insulation layer 150 may include a silicon compound, metal oxide, etc. For example, the gate insulation layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc. Alternatively, the gate insulation layer 150 may have a multilayer structure having a plurality of insulating layers including materials which are different from each other.

The first gate electrode 170 may be disposed in the first region 11 on the gate insulation layer 150 to overlap the channel region. For example, the first gate electrode 170 may be disposed on a portion of the gate insulation layer 150 under which the first active layer 130 is disposed. The first gate electrode 170 may include a metal, an alloy of a metal, metal nitride, conductive metal oxide, a transparent conductive material, etc. Alternatively, the first gate electrode 170 may have a multilayer structure including a plurality of layers.

The first insulating interlayer 190 may be disposed in the first region 11 and the second region 12 on the gate insulation layer 150 and the first gate electrode 170. In embodiments, the first insulating interlayer 190 may cover the first gate electrode 170 in the first region 11 on the gate insulation layer 150 and extend into the bending region 50 and may have a third opening overlapping the first opening and the second opening. For example, the first insulating interlayer 190 may sufficiently cover the first gate electrode 170 on the gate insulation layer 150 and may have a substantially flat upper surface without creating a step around the first gate electrode 170. Alternatively, the first insulating interlayer 190 may cover the first gate electrode 170 on the gate insulation layer 150 and may be disposed to have a substantially uniform thickness along a profile of the first gate electrode 170. The first insulating interlayer 190 may include a silicon compound, metal oxide, etc. Alternatively, the first insulating interlayer 190 may have a multilayer structure having a plurality of insulating layers including materials which are different from each other.

The gate electrode pattern 180 may be disposed in the first region 11 on the first insulating interlayer 190. The gate electrode pattern 180 may be disposed on a portion of the first insulating interlayer 190 under which the first gate electrode 170 is located. In another sectional view of the organic light emitting display device 100, the first gate electrode 170 and the gate electrode pattern 180 may function as the storage capacitor CST of FIG. 5. The gate electrode pattern 180 may include a metal, an alloy of a metal, metal nitride, conductive metal oxide, a transparent conductive material, etc. Alternatively, the gate electrode pattern 180 may have a multilayer structure including a plurality of layers.

The second gate electrode 175 may be disposed in the second region 12 on the first insulating interlayer 190. In other words, the second gate electrode 175 may be spaced apart from the gate electrode pattern 180. In embodiments, the second gate electrode 175 and the gate electrode pattern 180 may be disposed on the same layer and may be simultaneously formed using the same materials and the same process. The second gate electrode 175 may include a metal, an alloy of a metal, metal nitride, conductive metal oxide, a transparent conductive material, etc.

The second insulating interlayer 195 may be disposed in the first region 11 and the second region 12 on the gate electrode pattern 180 and the second gate electrode 175. In embodiments, the second insulating interlayer 195 may cover the gate electrode pattern 180 in the first region 11 on the first insulating interlayer 190 and the second gate electrode 175 in the second region 12 on the first insulating interlayer 190 and extend into the bending region 50 and may have a fourth opening overlapping the first opening, the second opening and the third opening. For example, the second insulating interlayer 195 may sufficiently cover the gate electrode pattern 180 and the second gate electrode 175 on the first insulating interlayer 190 and may have a substantially flat upper surface without creating a step around the gate electrode pattern 180 and the second gate electrode 175. Alternatively, the second insulating interlayer 195 may cover the gate electrode pattern 180 and the second gate electrode 175 on the first insulating interlayer 190 and may be disposed to have a substantially uniform thickness along a profile of the gate electrode pattern 180 and the second gate electrode 175. The second insulating interlayer 195 may include a silicon compound, metal oxide, etc. Alternatively, the second insulating interlayer 195 may have a multilayer structure having a plurality of insulating layers including materials which are different from each other.

The first source electrode 210 may be disposed in the first region 11 on the second insulating interlayer 195. The first source electrode 210 may be connected to the source region of the first active layer 130 through a first contact hole 212 formed by removing a first portion of each of the gate insulating layer 150, the first insulating interlayer 190, and the second insulating interlayer 195. The first source electrode 210 may include a metal, an alloy of a metal, metal nitride, conductive metal oxide, a transparent conductive material, etc. For example, the first source electrode 210 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), etc. These may be used alone or in combination with each other.

In embodiments, the first source electrode 210 may have a first thickness T1 and may be formed as a single layer. For example, the first source electrode 210 may include Mo. In addition, the first source electrode 210 may function as an electrode. In other words, since the first source electrode 210 functions as an electrode including Mo, the first source electrode 210 may have a relatively higher specific resistance than the first drain electrode 230, the signal wire 350, and the connection pattern 370 that function as a wire including Al. In other embodiments, the first source electrode 210 may have a multilayer structure including a plurality of layers.

The second active layer 135 may be disposed in the second region 12 on the second insulating interlayer 195. The second active layer 135 may be disposed on a portion of the second insulating interlayer 195 under which the second gate electrode 175 is disposed. The second active layer 135 may include a metal oxide semiconductor. In other words, the second active layer 135 may be a semiconductor oxide layer including a binary compound ($AB_x$), a ternary compound ($AB_xC_y$), a quaternary compound ($AB_xC_yD_z$), or the like containing indium (In), zinc (Zn), gallium (Ga), tin (Sn), titanium (Ti), aluminum (Al), hafnium (Hf), zirconium (Zr), magnesium (Mg), etc. For example, the second active layer 135 may include zinc oxide ($ZnO_x$), gallium oxide ($GaO_x$), titanium oxide ($TiO_x$), tin oxide ($SnO_x$), indium oxide ($InO_x$), indium-gallium oxide (IGO), indium-zinc oxide (IZO), indium-tin oxide (ITO), gallium-zinc oxide (GZO), zinc-magnesium oxide (ZMO), zinc-tin oxide (ZTO), zinc-zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), etc.

The second source electrode 215 and the second drain electrode 235 may be disposed in the second region 12 on the second insulating interlayer 195 to overlap the second active layer 135. The second source electrode 215 may cover a first side portion of the second active layer 135 and the second drain electrode 235 may cover a second side portion of the second active layer 135 which opposes the first side portion of the second active layer 135 with a second channel region disposed between the first side portion and the second side portion of the second active layer 135. In other words, the second source electrode 215 and the second drain electrode 235 may be disposed in both lateral portions of the second active layer 135 and may expose a part of an upper surface of the second active layer 135. Each of the second source electrode 215 and the second drain electrode 235 may include the same material as the first source electrode 210. For example, each of the second source electrode 215 and the second drain electrode 235 may include a metal, an alloy of a metal, metal nitride, conductive metal oxide, a transparent conductive material, etc. These may be used alone or in combination with each other.

In embodiments, the second source electrode 215 and the second drain electrode 235 may have the first thickness T1 and may be formed as a single layer. For example, each of the second source electrode 215 and the second drain electrode 235 may include Mo. In addition, each of the second source electrode 215 and the second drain electrode 235 may function as an electrode. In other words, since each of the second source electrode 215 and the second drain electrode 235 function as an electrode including Mo, each of the second source electrode 215 and the second drain electrode 235 may have a relatively higher specific resistance than the first drain electrode 230, the signal wire 350, and the connection pattern 370 that function as a wire including Al. In other embodiments, the second drain electrode 235 and the first source electrode 210 may be integrally formed.

In embodiments, the first source electrode 210, the second source electrode 215, and second drain electrodes 215 and 235 may be disposed on the same layer and may be simultaneously formed using the same materials. In other embodiments, each of the second source electrode 215 and the second drain electrode 235 may have a multilayer structure including a plurality of layers. Accordingly, the switching transistor 255 including the second active layer 135, the second gate electrode 175, the second source electrode 215, and the second drain electrode 235 may be embodied. Here, the switching transistor 255 may include an oxide-based semiconductor. In addition, the switching transistor 255 may have a bottom gate structure. For example, the switching transistor 255 may be one of the second to seventh transistors TR2, TR3, TR4, TR5, TR6, and TR7 shown in FIG. 5.

The protective insulating layer 400 may be disposed in the first region 11 and the second region 12 on the second insulating interlayer 195, the first source electrode 210, the second source electrode 215, and the second drain electrode 235. In embodiments, the protective insulating layer 400 may cover the first source electrode 210, the second source electrode 215, and second drain electrodes 235 in the first region 11 and the second region 12 on the second insulating interlayer 195 and extend into the bending region 50, and may have a fifth opening overlapping the first to fourth openings. For example, the protective insulating layer 400 may sufficiently cover the first source electrode 210, the second source electrode 215 and the second drain electrode 235 on the second insulating interlayer 195 and may have a substantially flat upper surface without a step around the first source electrode 210, the second source electrode and the second drain electrode 235. Alternatively, the protective insulating layer 400 may cover the first source electrode 210, the second source electrode 215 and the second drain electrode 235 on the second insulating interlayer 195 and may be disposed to have a substantially uniform thickness along profiles of the first source electrode 210, the second source electrode 215, and the second drain electrode 235. The protective insulating layer 400 may include a silicon compound, metal oxide, etc. Alternatively, the protective insulating layer 400 may have a multilayer structure having a plurality of insulating layers including materials which are different from each other.

The first drain electrode 230 may be disposed in the first region 11 on the protective insulating layer 400. In other words, the first source electrode 210 and the first drain electrode 230 may be disposed on different layers from each other. The first drain electrode 230 may be connected to the drain region of the first active layer 130 through a second contact hole 232 formed by removing a second portion of each of the gate insulating layer 150, the first insulating interlayer 190, the second insulating interlayer 195, and the protective insulating layer 400. In embodiments, the first drain electrode 230 may have a second thickness T2 greater than the first thickness T1 and may be formed as a plurality of layers.

The first drain electrode 230 may include a metal, an alloy of a metal, metal nitride, conductive metal oxide, a transparent conductive material, etc. These may be used alone or in combination with each other. In embodiments, the first drain electrode 230 may have a stack structure of Ti/Al/Ti. In addition, the first drain electrode 230 may function as a wire. In other words, since the first drain electrode 230 functions as the wire including Al, the first drain electrode 230 may have a relatively lower specific resistance than the first source electrode 210, the second source electrode 215, and the second drain electrode 235 that function as an electrode including Mo.

For example, in order to drive a conventional organic light emitting display device with a high resolution, the conventional organic light emitting display device must include a relatively large number of signal wires. In this case, the signal wires may be disposed on the same insulating interlayer, for example, the second insulating interlayer 195. When the conventional organic light emitting display device includes a relatively large number of signal wires, a width of each of the signal wires may be relatively reduced to arrange the signal wires in a limited space. Because each of the signal wires has the reduced line width, a resistance of each of the signal wires may be increased. That is, an organic light emitting display device having a high resolution may not be manufactured in a conventional manner.

In embodiments of the present inventive concept, the first drain electrode 230 of the driving transistor 250 included in the organic light emitting display device 100 is disposed on a layer different from the first source electrode 210, the second source electrode 215, and the second drain electrode 235, so that the first drain electrode 230 may be formed to have a wire including Al and having a relatively large width and a relatively large thickness. That is, because the first drain electrode 230 may have a relatively low specific resistance and be formed on a layer different from the first source electrode 210, the second source electrode 215 and the second drain electrode 235, for example, on the protective insulating layer 400, the width and the thickness of the first drain electrode 230 may be formed greater than those of the first source electrode 210, the second source electrode 215 and the second drain electrode 235. As a result, the resistance of the first drain electrode 230 and a conductive line which is formed of the same material as the first drain electrode 230 may be reduced. Accordingly, the organic light emitting display device 100 has the driving transistor 250 including the first drain electrode 230 having a relatively large width and a relatively large thickness so that the organic light emitting display device 100 may be driven with high resolution.

In addition, in embodiments, the first drain electrode 230 may extend in the first direction D1 toward the first soured electrode 210 that is a direction from the first region 11 toward the second region 12. In other words, a part of the first drain electrode 230 may overlap the first gate electrode 170, the gate electrode pattern 180, and the first source electrode 210, and may not overlap the second active layer 135 (e.g., the first drain electrode 230 does not overlap the second active layer 135 in order not to affect a driving of the switching transistor 255) in a plan view. A high power supply voltage (e.g., the high power supply voltage ELVDD of FIG. 5) may be applied to the first drain electrode 230. That is, the first drain electrode 230 may shield the driving transistor 250 from the signal wire 350 to which the data signal (e.g., the data signal DATA of FIG. 5) is applied.

For example, in a conventional organic light emitting display device, characteristics of a driving transistor disposed adjacent to a signal wire 350 may be fluctuated when voltage levels of the signal wire 350 are changed.

In embodiments of the present inventive concept, as a constant voltage (e.g., the high power supply voltage ELVDD) is applied to the first drain electrode 230 of the driving transistor 250 included in the organic light emitting display device 100 and the driving transistor 250 is shielded from the signal wire 350, characteristics of the driving transistor 250 may be maintained uniformly.

Accordingly, the driving transistor 250 including the first active layer 130, the first gate electrode 170, the first source electrode 210, and the first drain electrode 230 may be embodied. Here, the driving transistor 250 may have a driving transistor including a silicon-based semiconductor. In addition, the driving transistor 250 may have a transistor having a top gate structure. For example, the driving transistor 250 may correspond to the first transistor TR1 shown in FIG. 5.

Although the organic light emitting display device 100 has been described as having a configuration including two transistors (e.g., the driving transistor 250 and the switching transistor 255), but the configuration of the present inventive concept is not limited thereto. For example, the organic light emitting display device 100 may have a configuration including at least two transistors and at least one capacitor.

The first planarization layer 270 may be disposed on the protective insulating layer 400 and the first drain electrode 230. The first planarization layer 270 may be disposed on the protective insulating layer 400. For example, the first planarization layer 270 may be disposed as a relatively thick thickness to sufficiently cover the first drain electrode 230, and in this case, the first planarization layer 270 may have a substantially flat upper surface. In addition, a planarization process may be added to the first planarization layer 270 in order to implement the flat upper surface of the first planarization layer 270. In embodiments, the first planarization layer 270 may fill the first to fifth openings disposed in the bending region 50. In other words, the first planarization layer 270 may be in direct contact with the upper surface of the second organic layer 113 located in the bending region 50. The first planarization layer 270 may include an organic material or an inorganic material. In embodiments, the first planarization layer 270 may include an organic material. For example, the first planarization layer 270 may include a photoresist, a polyacryl-based resin, a polyimide-based resin, a polyamide-based resin, a siloxane-based resin, an acryl-based resin, an epoxy-based resin, or the like.

The signal wire 350 and the connection pattern 370 may be disposed on the first planarization layer 270. A data signal (e.g., a data signal DATA of shown in FIG. 5) may be applied to the signal wire 350 and a high power supply voltage (e.g., a high power supply voltage ELVDD shown in FIG. 5) may be applied to the connection pattern 370. In other words, the signal wire 350 may correspond to a wire for the data signal DATA of shown in FIG. 5 and the connection pattern 370 may correspond to a second terminal of the sixth transistor TR6 shown in FIG. 5. For example, the signal wire 350 may transmit the data signal DATA to the switching transistor 255 and the data signal DATA transmitted to the switching transistor 255 (e.g., the second drain electrode 235 of the switching transistor 255) may be applied to the driving transistor 250 (e.g., the first gate electrode 170 of the driving transistor 250). In addition, the first drain electrode 230 of the driving transistor 250 may transmit the high power supply voltage ELVDD to the connection pattern 370 (e.g., the second terminal of the sixth transistor TR6 shown in FIG. 5), and the high power supply voltage ELVDD transmitted to the connection pattern 370 may be applied to the lower electrode 290.

Each of the signal wire 350 and the connection pattern 370 may include a metal, an alloy of a metal, metal nitride, conductive metal oxide, a transparent conductive material, etc. These may be used alone or in combination with each other. In embodiments, each of the signal wire 350 and the connection pattern 370 may function as a wire and may have a stacked structure of Ti/Al/Ti.

The second planarization layer 275 may be disposed on the first planarization layer 270, the signal wire 350, and the connection pattern 370. The second planarization layer 275 may be disposed on the first planarization layer 270. For example, the second planarization layer 275 may have a relatively thick thickness to sufficiently cover the signal wire 350 and the connection pattern 370, and in this case, the second planarization layer 275 may have a substantially flat upper surface. In addition, a planarization process may be added to the second planarization layer 275 in order to implement such a flat upper surface of the second planarization layer 275. Alternatively, the second planarization layer 275 may not be disposed in the pad region 60. The second planarization layer 275 may include an organic material or an inorganic material. In embodiments, the second planarization layer 275 may include an organic material.

The lower electrode 290 may be disposed on the second planarization layer 275. The lower electrode 290 may be connected to the connection pattern 370 through a contact hole formed by removing a part of the second planarization layer 275. The lower electrode 290 may include a metal, an alloy of a metal, metal nitride, conductive metal oxide, a transparent conductive material, etc. These may be used alone or in combination with each other. Alternatively, the lower electrode 290 may have a multilayer structure including a plurality of layers.

The pixel defining layer 310 may be disposed on a part of the lower electrode 290 and the second planarization layer 275. The pixel defining layer 310 may cover both lateral portions of the lower electrode 290 in a cross-sectional view and may expose a part of an upper surface of the lower electrode 290. The pixel defining layer 310 may be formed of an organic material or an inorganic material. In embodiments, the pixel defining layer 310 may include the organic material. Alternatively, the lower electrode 290 may not be disposed in the pad region 60.

The light emitting layer 330 may be disposed on the lower electrode 290 exposed by the pixel defining layer 310. The light emitting layer 330 may be formed using at least one of light emitting materials for emitting different color lights (i.e., red light, green light, blue light, etc.) according to sub-pixels. Alternatively, the light emitting layer 330 may be formed by laminating a plurality of light emitting materials for emitting the different color lights such as red light, green light, or blue light to emit white light as a whole. In this case, a color filter may be disposed on the light emitting layer 330 to overlap the light emitting layer 330 on an upper surface of thin film encapsulation structure 450. The color filter may include at least one of a red color filter, a green color filter, and a blue color filter. Alternatively, the color filter may include a yellow color filter, a cyan color filter, and a magenta color filter. The color filter may include a photosensitive resin, a color photoresist, etc.

The upper electrode 340 may be disposed on the pixel defining layer 310 and the light emitting layer 330. The upper electrode 340 may cover the light emitting layer 330 and the pixel defining layer 310 and may be disposed entirely on the light emitting layer 330 and the pixel defining layer 310. In embodiments, a low power supply voltage (e.g., a low power supply voltage ELVSS shown in FIG. 5) may be applied to the upper electrode 340. The upper electrode 340 may include a metal, an alloy of a metal, metal nitride, conductive metal oxide, a transparent conductive material, etc. These may be used alone or in combination with each other. Alternatively, the upper electrode 340 may have a multilayer structure including a plurality of layers. Accordingly, the sub-pixel structure 200 including the lower electrode 290, the light emitting layer 330, and the upper electrode 340 may be embodied.

The first thin film encapsulation layer 451 may be disposed in the light emitting region 30 on the upper electrode 340. The first thin film encapsulation layer 451 may cover the upper electrode 340 in the light emitting region 30 and may be disposed as a substantially uniform thickness along a profile of the upper electrode 340. The first thin film encapsulation layer 451 may prevent the sub-pixel structure 200 from being deteriorated due to penetration of moisture, oxygen, etc. In addition, the first thin film encapsulation layer 451 may function to protect the sub-pixel structure 200 from an external impact. The first thin film encapsulation layer 451 may include a flexible inorganic material.

The second thin film encapsulation layer 452 may be disposed in the light emitting region 30 on the first thin film encapsulation layer 451. The second thin film encapsulation layer 452 may improve flatness of the organic light emitting display device 100 and may protect the sub-pixel structure 200. The second thin film encapsulation layer 452 may include a flexible organic material.

The third thin film encapsulation layer 453 may be disposed in the light emitting region 30 on the second thin film encapsulation layer 452. The third thin film encapsulation layer 453 may cover the second thin film encapsulation layer 452 in the light emitting region 30 and may be disposed as a substantially uniform thickness along a profile of the second thin film encapsulation layer 452. The third thin film encapsulation layer 453 may prevent the sub-pixel structure 200 from being deteriorated due to the penetration of moisture, oxygen, etc., together with the first thin film encapsulation layer 451. In addition, the third thin film encapsulation layer 453 may function to protect the sub-pixel structure 200 from an external impact together with the first thin film encapsulation layer 451 and the second thin film encapsulation layer 452. The third thin film encapsulation layer 453 may include a flexible inorganic material. Accordingly, the thin film encapsulation structure 450 including the first thin film encapsulation layer 451, the second thin film encapsulation layer 452, and the third thin film encapsulation layer 453 may be embodied. Alternatively, the thin film encapsulation structure 450 may have a five-layers structure formed by laminating first to fifth thin film encapsulation layers or a seven-layers structure formed by laminating first to seventh thin film encapsulation layers.

As the organic light emitting display device 100 according to embodiments of the present inventive concept includes the driving transistor 250 including the first drain electrode 230 and the first source electrode 210 that are disposed on different layers to each other, the first drain electrode 230 may have a relatively large width and a relatively large thickness. Accordingly, the organic light emitting display device 100 may be driven with a high resolution.

In addition, as the organic light emitting display device 100 according to embodiments of the present inventive concept includes the first drain electrode 230 that shields the first active layer 130, a parasitic capacitance may not be formed between the signal wire 350 and the driving transistor 250. Accordingly, the organic light emitting display device 100 may maintain a uniform characteristics of the driving transistor 250.

FIGS. 7, 8, 9, 10, 11, 12, and 13 are cross-sectional views showing a method of manufacturing an organic light emitting display device according to embodiments of the present inventive concept.

Figure 7:
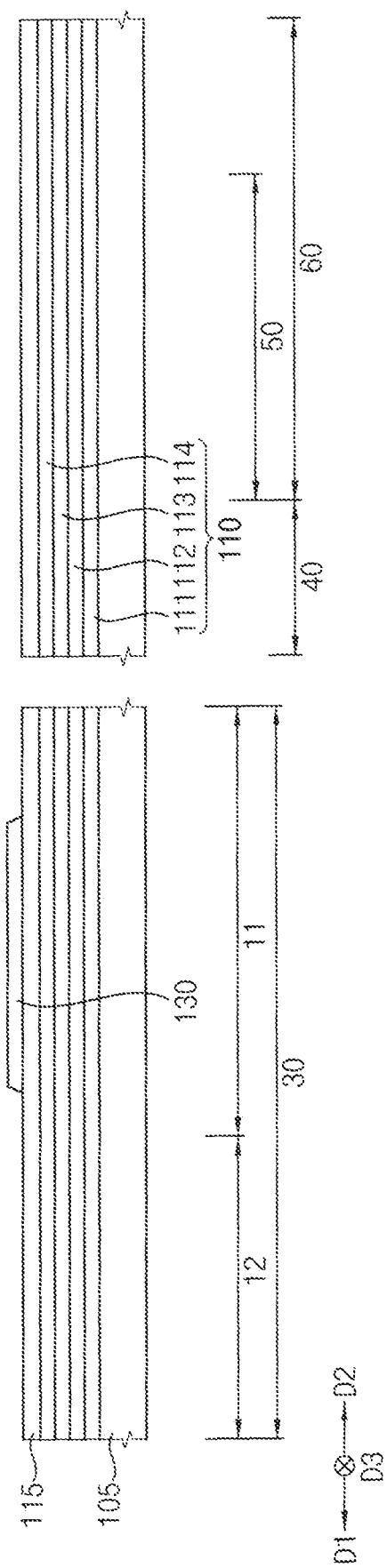
FIGS. 7, 8, 9, 10, 11, 12, and 13 are cross-sectional views showing a method of manufacturing an organic light emitting display device according to embodiments of the present inventive concept.

Referring to FIG. 7, a rigid glass substrate 105 may be provided. A first organic layer 111 may be formed on the glass substrate 105. The first organic layer 111 may be formed on the entire glass substrate 105 and may be formed using a flexible organic material such as polyimide.

A first bather layer 112 may be formed on the entire first organic layer 111. The first bather layer 112 may block moisture penetrating through the first organic layer 111. The first bather layer 112 may be formed using a flexible inorganic material such as silicon oxide, silicon nitride, etc.

A second organic layer 113 may be formed on the first bather layer 112. The second organic layer 113 may be formed on the entire first bather layer 112 and may be formed using a flexible organic material such as polyimide.

A second bather layer 114 may be formed on the entire second organic layer 113. The second bather layer 114 may block moisture penetrating through the second organic layer 113. The second bather layer 114 may be formed using a flexible inorganic material such as silicon oxide, silicon nitride, etc. Accordingly, a substrate 110 including the first organic layer 111, the first bather layer 112, the second organic layer 113, and the second bather layer 114 may be formed.

Since the substrate 110 is thin and flexible, the substrate 110 may be formed on the rigid glass substrate 105 to support a formation of an upper structure (e.g., a driving transistor, a switching transistor, a sub-pixel structure, etc.). For example, after forming the upper structure on the substrate 110, the glass substrate 105 may be removed. In other words, due to flexible physical properties of the first organic layer 111, the first bather layer 112, the second organic layer 113, and the second bather layer 114, it may be difficult to directly form the upper structure on the first organic layer 111, the first bather layer 112, the second organic layer 113, and the second bather layer 114. In consideration of the flexible physical properties, the upper structure is formed on the first organic layer 111, the first bather layer 112, the second organic layer 113, and the second bather layer 114 using the glass substrate 105 as a supporting substrate, and then the glass substrate 105 is removed so that the first organic layer 111, the first bather layer 112, the second organic layer 113, and the second bather layer 114 may be used as the substrate 110.

A buffer layer 115 may be formed on the substrate 110. In embodiments, the buffer layer 115 may be formed in a first region 11 and a second region 12 on the substrate 110. That is, the buffer layer 115 may be formed on the entire substrate 110. The buffer layer 115 may prevent metal atoms or impurities from being diffused from the substrate 110 into the driving transistor, the switching transistor, and the sub-pixel structure, and may control a heat transfer rate during a crystallization process for forming a first active layer to obtain a substantially uniform first active layer. In addition, the buffer layer 115 may serve to improve flatness of a surface of the substrate 110 when the surface of the substrate 110 is not uniform. Depending on a type of the substrate 110, at least two buffer layers 115 may be provided on the substrate 110, or the buffer layer 115 may not be formed on the substrate 110. For example, the buffer layer 115 may be formed using an organic material or an inorganic material.

A first active layer 130 may be formed in the first region 11 on the buffer layer 115. For example, the first active layer 130 may include a metal oxide semiconductor, amorphous silicon, polysilicon, an organic semiconductor, etc. In embodiments, the first active layer 130 may include a silicon-based semiconductor and may be formed using the amorphous silicon or the polysilicon. In embodiments, the first active layer 130 may have a source region, a drain region and a channel region.

Figure 8:
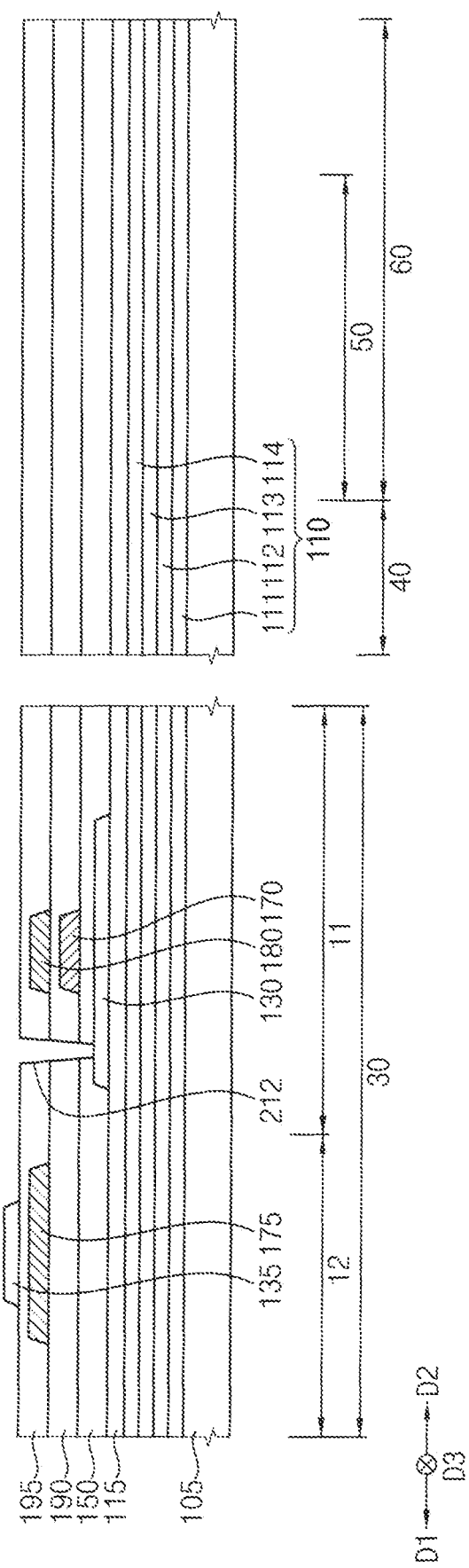

Referring to FIG. 8, a gate insulation layer 150 may be formed in the first region 11 and the second region 12 on the buffer layer 115 and the first active layer 130. For example, the gate insulation layer 150 may cover the first active layer 130 in the first region 11 on the substrate 110 and may extend into the bending region 50. That is, the gate insulating layer 150 may be formed on the entire buffer layer 115. For example, the gate insulation layer 150 may sufficiently cover the first active layer 130 on the buffer layer 115 and may have a substantially flat upper surface without creating a step around the first active layer 130. Alternatively, the gate insulation layer 150 may cover the first active layer 130 on the buffer layer 115 and may be formed to have a substantially uniform thickness along a profile of the first active layer 130. The gate insulation layer 150 may be formed using a silicon compound, metal oxide, etc. For example, the gate insulation layer 150 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, etc. Alternatively, the gate insulation layer 150 may have a multilayer structure having a plurality of insulating layers including materials which are different from each other.

A first gate electrode 170 may be formed in the first region 11 on the gate insulation layer 150. For example, the first gate electrode 170 may be formed on a portion of the gate insulation layer 150 under which the channel region of the first active layer 130 is disposed. The first gate electrode 170 may be formed using a metal, an alloy of a metal, metal nitride, conductive metal oxide, a transparent conductive material, etc. Alternatively, the first gate electrode 170 may have a multilayer structure including a plurality of layers.

A first insulating interlayer 190 may be formed in the first region 11 and the second region 12 on the gate insulation layer 150 and the first gate electrode 170. For example, the first insulating interlayer 190 may cover the first gate electrode 170 in the first region 11 on the gate insulation layer 150 and may extend into the bending region 50. That is, the first insulating interlayer 190 may be formed on the entire gate insulating layer 150. For example, the first insulating interlayer 190 may sufficiently cover the first gate electrode 170 on the gate insulation layer 150 and may have a substantially flat upper surface without a step around the first gate electrode 170. Alternatively, the first insulating interlayer 190 may cover the first gate electrode 170 on the gate insulation layer 150 and may be formed to have a substantially uniform thickness along a profile of the first gate electrode 170. The first insulating interlayer 190 may be formed using a silicon compound, metal oxide, etc. Alternatively, the first insulating interlayer 190 may have a multilayer structure having a plurality of insulating layers including materials which are different from each other.

A gate electrode pattern 180 may be formed in the first region 11 on the first insulating interlayer 190. The gate electrode pattern 180 may be formed on a portion of the first insulating interlayer 190 under which the first gate electrode 170 is disposed. The gate electrode pattern 180 may be formed using a metal, an alloy of a metal, metal nitride, conductive metal oxide, a transparent conductive material, etc. Alternatively, the gate electrode pattern 180 may have a multilayer structure including a plurality of layers.

A second gate electrode 175 may be formed in the second region 12 on the first insulating interlayer 190. In embodiments, the second gate electrode 175 and the gate electrode pattern 180 may be disposed on the same layer and may be simultaneously formed using the same materials. The second gate electrode 175 may be formed using a metal, an alloy of a metal, metal nitride, conductive metal oxide, a transparent conductive material, etc.

A second insulating interlayer 195 may be formed in the first region 11 and the second region 12 on the gate electrode pattern 180 and the second gate electrode 175. For example, the second insulating interlayer 195 may cover the gate electrode pattern 180 in the first region 11 on the first insulating interlayer 190 and the second gate electrode 175 in the second region 12 on the first insulating interlayer 190 and may extend into the bending region 50. That is, the second insulating interlayer 195 may be formed on the entire first insulating interlayer 190. For example, the second insulating interlayer 195 may sufficiently cover the gate electrode pattern 180 and the second gate electrode 175 on the first insulating interlayer 190 and may have a substantially flat upper surface without a step around the gate electrode pattern 180 and the second gate electrode 175. Alternatively, the second insulating interlayer 195 may cover the gate electrode pattern 180 and the second gate electrode 175 on the first insulating interlayer 190 and may be formed to have a substantially uniform thickness along a profile of the gate electrode pattern 180 and the second gate electrode 175. The second insulating interlayer 195 may be formed using a silicon compound, metal oxide, etc. Alternatively, the second insulating interlayer 195 may have a multilayer structure having a plurality of insulating layers including materials which are different from each other.

A second active layer 135 may be formed in the second region 12 on the second insulating interlayer 195. The second active layer 135 may be formed on a portion of the second insulating interlayer 195 under which the second gate electrode 175 is disposed. The second active layer 135 may be formed using a metal oxide semiconductor. In other words, the second active layer 135 may be a semiconductor oxide layer including a binary compound, a ternary compound, a quaternary compound, or the like containing In, Zn, Ga, Sn, Ti, Al, Hf, Zr, Mg, etc. For example, the second active layer 135 may include $ZnO_x$, $GaO_x$, $TiO_x$, $SnO_x$, $InO_x$, IGO, IZO, ITO, GZO, ZMO, GZO, $ZnZr_xO_y$, IGZO, IZTO, IGHO, TAZO, IGTO, etc.

After the second active layer 135 is formed, a first contact hole 212 exposing a source region of the first active layer 130 may be formed by removing a first portion of each of the gate insulating layer 150, the first insulating interlayer 190, and the second insulating interlayer 195.

Figure 9:
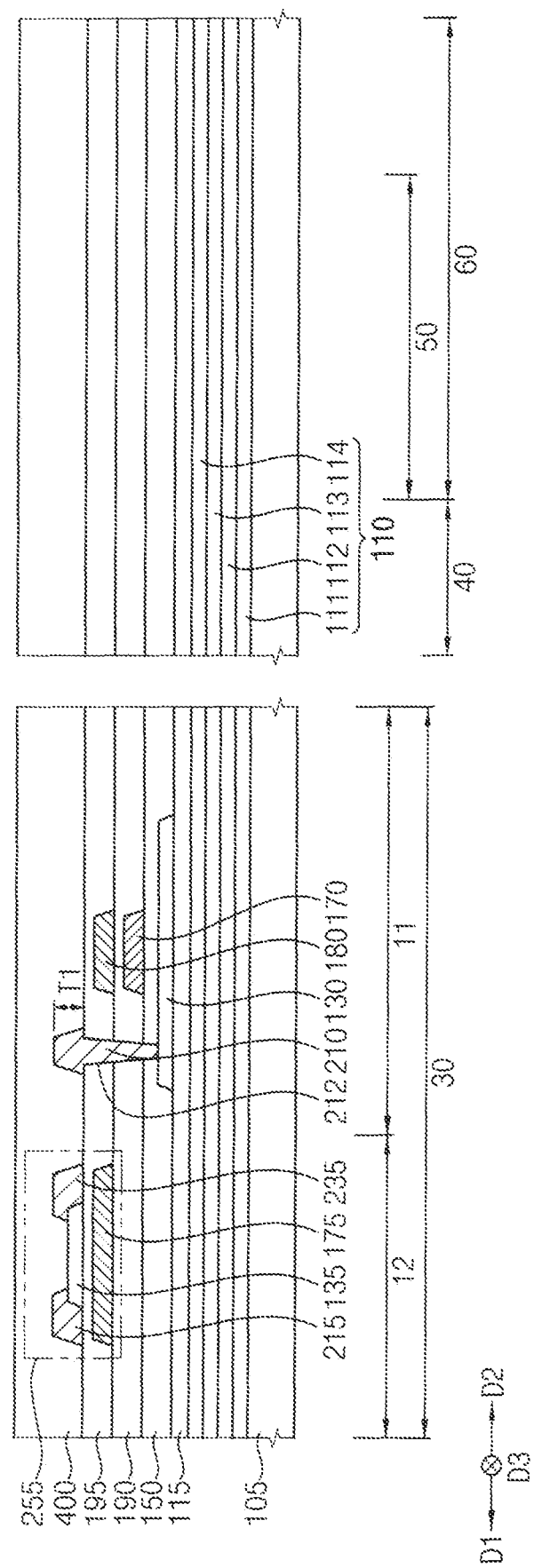

Referring to FIG. 9, a first source electrode 210 may be formed to be connected to the source region of the first active layer 130 through the first contact hole 212. The first source electrode 210 may be formed using a metal, an alloy of a metal, metal nitride, conductive metal oxide, a transparent conductive material, etc. For example, the first source electrode 210 may include Au, Ag, Al, Pt, Ni, Ti, Pd, Mg, Ca, Li, Cr, Ta, W, Cu, Mo, Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, etc. These may be used alone or in combination with each other.

In embodiments, the first source electrode 210 may have a first thickness T1 and may be formed as a single layer. For example, the first source electrode 210 may be formed using Mo. In other embodiments, the first source electrode 210 may have a multilayer structure including a plurality of layers.

A second source electrode 215 and the second drain electrode 235 may be formed in the second region 12 on the second insulating interlayer 195. The second source electrode 215 may cover a first side portion of the second active layer 135 and the second drain electrode 235 may cover a second side portion of the second active layer 135 which opposes the first side portion. In other words, the second source electrode 215 and the second drain electrode 235 may be formed in both lateral portions of the second active layer 135 and may expose a part of an upper surface of the second active layer 135. Each of the second source electrode 215 and the second drain electrode 235 may be formed using a metal, an alloy of a metal, metal nitride, conductive metal oxide, a transparent conductive material, etc. These may be used alone or in combination with each other.

In embodiments, each of the second source electrode 215 and the second drain electrode 235 may have the first thickness T1 and may be formed as a single layer. For example, each of the second source electrode 215 and the second drain electrode 235 may include Mo. In addition, the first source electrode 210, the second source electrode 215 and the second drain electrodes 235 may be formed on the same layer and may be simultaneously formed using the same materials. In other embodiments, each of second source electrode 215, the second drain electrode 235 and the first source electrode 210 may have a multilayer structure including a plurality of layers. Accordingly, a switching transistor 255 including the second active layer 135, the second gate electrode 175, the second source electrode 215, and the second drain electrode 235 may be formed.

A protective insulating layer 400 may be formed in the first region 11 and the second region 12 on the second insulating interlayer 195, the first source electrode 210, the second source electrode 215, and the second drain electrode 235. For example, the protective insulating layer 400 may cover the first source electrode 210 in the first region 11 on the second insulating interlayer 195 and the second source electrode 215 and the second drain electrode 235 in the second region 12 on the second insulating interlayer 195 and may extend into the bending region 50. That is, the protective insulating layer 400 may be formed on the entire second insulating interlayer 195. For example, the protective insulating layer 400 may sufficiently cover the first source electrode 210 and the second source electrode 215 and the second drain electrode 235 on the second insulating interlayer 195 and may have a substantially flat upper surface without a step around the first source electrode 210, the second source electrode 215 and the second drain electrode 235. Alternatively, the protective insulating layer 400 may cover the first source electrode 210, the second source electrode 215 and the second drain electrode 235 on the second insulating interlayer 195 and may be formed as a substantially uniform thickness along profiles of the first source electrode 210, the second source electrode 215 and the second drain electrode 235. The protective insulating layer 400 may be formed using a silicon compound, metal oxide, etc. Alternatively, the protective insulating layer 400 may have a multilayer structure having a plurality of insulating layers including materials which are different from each other.

Figure 10:
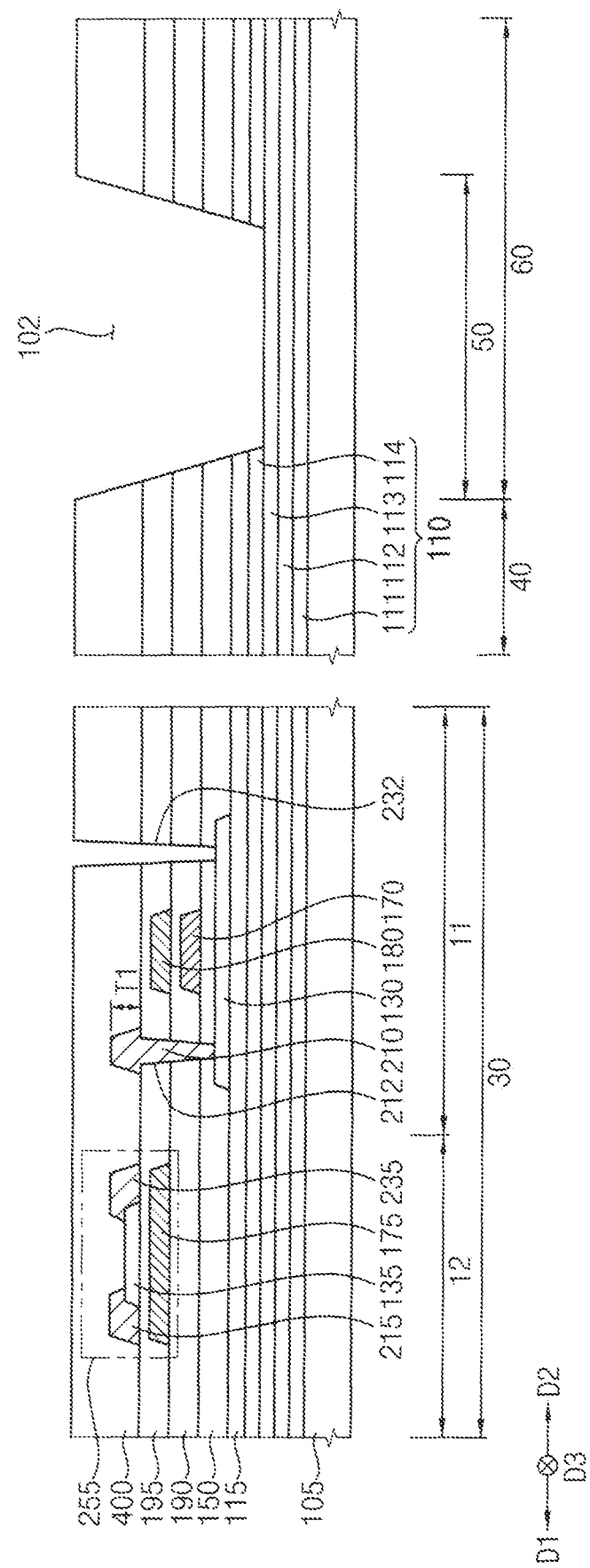

Referring to FIG. 10, after the protective insulating layer 400 is formed, a second contact hole 232 exposing the drain region of the first active layer 130 may be formed by removing a second portion of each of the gate insulating layer 150, the first insulating interlayer 190, the second insulating interlayer 195, and the protective insulating layer 400, and an opening 102 exposing an upper surface of the second organic layer 113 disposed in the bending region 50 may be formed by removing a part of each of the second bather layer 114, the buffer layer 115, the gate insulating layer 150, the first insulating interlayer 190, the second insulating interlayer 195, and the protective insulating layer 400.

Figure 11:
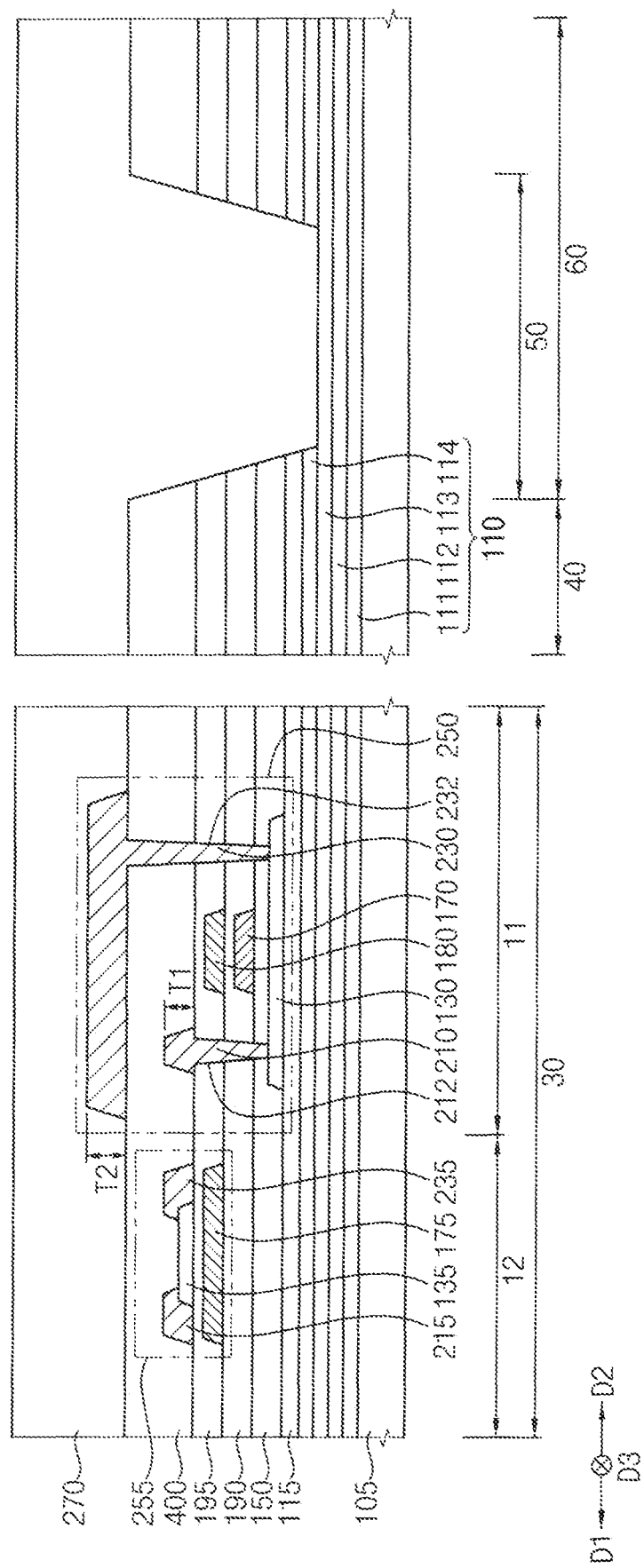

Referring to FIG. 11, a first drain electrode 230 which is connected to the drain region of the first active layer 130 through the second contact hole 232 may be formed. In embodiments, the first drain electrode 230 may have a second thickness T2 greater than the first thickness T1 and may be formed as a plurality of layers. The first drain electrode 230 may be formed using a metal, an alloy of a metal, metal nitride, conductive metal oxide, a transparent conductive material, etc. These may be used alone or in combination with each other. In embodiments, the first drain electrode 230 may have a stack structure of Ti/Al/Ti. In addition, the first drain electrode 230 may extend toward a first source electrode 210 in a first direction D1 that is a direction from the first region 11 to the second region 12. In other words, a part of the first drain electrode 230 may overlap the first gate electrode 170, the gate electrode pattern 180, and the first source electrode 210, and may not overlap the second active layer 135. Accordingly, a driving transistor 250 including the first active layer 130, the first gate electrode 170, the first source electrode 210, and the first drain electrode 230 may be formed.

A first planarization layer 270 may be formed on the protective insulating layer 400 and the first drain electrode 230. The first planarization layer 270 may be formed on the entire protective insulating layer 400. For example, the first planarization layer 270 may be formed as a relatively thick thickness to sufficiently cover the first drain electrode 230, and in this case, the first planarization layer 270 may have a substantially flat upper surface. In addition, a planarization process may be added to the first planarization layer 270 in order to implement the flat upper surface of the first planarization layer 270. In embodiments, the first planarization layer 270 may fill the opening 102 disposed in the bending region 50. In other words, the first planarization layer 270 may be in direct contact with the upper surface of the second organic layer 113 disposed in the bending region 50. The first planarization layer 270 may include an organic material or an inorganic material. In embodiments, the first planarization layer 270 may be formed using an organic material. For example, the first planarization layer 270 may include a photoresist, a polyacryl-based resin, a polyimide-based resin, a polyamide-based resin, a siloxane-based resin, an acryl-based resin, an epoxy-based resin, or the like.

Figure 12:
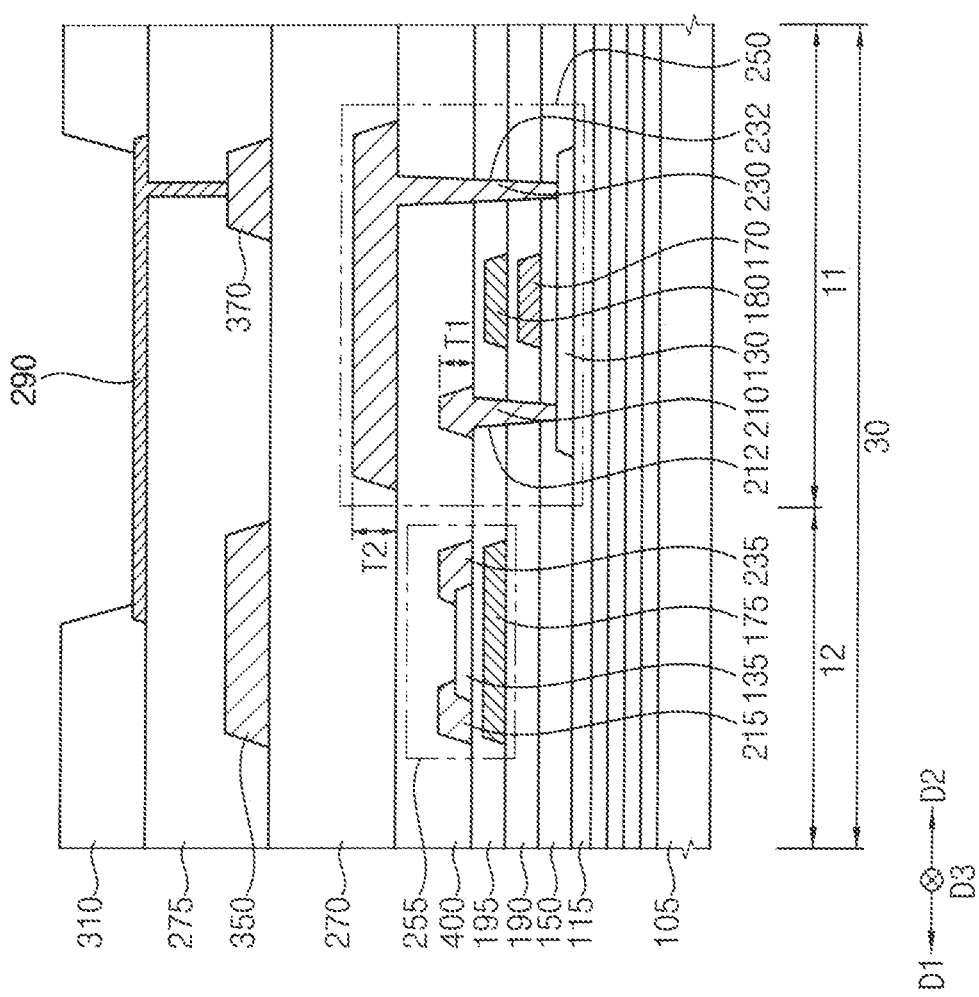

Referring to FIG. 12, a signal wire 350 and a connection pattern 370 may be formed on the first planarization layer 270. Each of the signal wire 350 and the connection pattern 370 may be formed using a metal, an alloy of a metal, metal nitride, conductive metal oxide, a transparent conductive material, etc. These may be used alone or in combination with each other. In embodiments, each of the signal wire 350 and the connection pattern 370 may be simultaneously formed using the same materials and may have a stacked structure of Ti/Al/Ti.

A second planarization layer 275 may be formed on the first planarization layer 270, the signal wire 350, and the connection pattern 370. The second planarization layer 275 may be formed on the entire first planarization layer 270. For example, the second planarization layer 275 may be formed as a relatively thick thickness to sufficiently cover the signal wire 350 and the connection pattern 370, and in this case, the second planarization layer 275 may have a substantially flat upper surface. In addition, a planarization process may be added to the second planarization layer 275 in order to implement such a flat upper surface of the second planarization layer 275. Alternatively, the second planarization layer 275 may not be formed in the pad region 60. The second planarization layer 275 may include an organic material or an inorganic material. In embodiments, the second planarization layer 275 may be formed using an organic material.

A lower electrode 290 may be formed on the second planarization layer 275. The lower electrode 290 may be connected to the connection pattern 370 through a contact hole formed by removing a part of the second planarization layer 275. The lower electrode 290 may be formed using a metal, an alloy of a metal, metal nitride, conductive metal oxide, a transparent conductive material, etc. These may be used alone or in combination with each other. Alternatively, the lower electrode 290 may have a multilayer structure including a plurality of layers.

A pixel defining layer 310 may be formed on a part of the lower electrode 290 and the second planarization layer 275. The pixel defining layer 310 may cover both lateral portions of the lower electrode 290 in a cross-sectional view and may expose a part of an upper surface of the lower electrode 290. The pixel defining layer 310 may be formed of an organic material or an inorganic material. In embodiments, the pixel defining layer 310 may be formed using the organic material. Alternatively, the pixel defining layer 310 may not be formed in the pad region 60.

Figure 13:
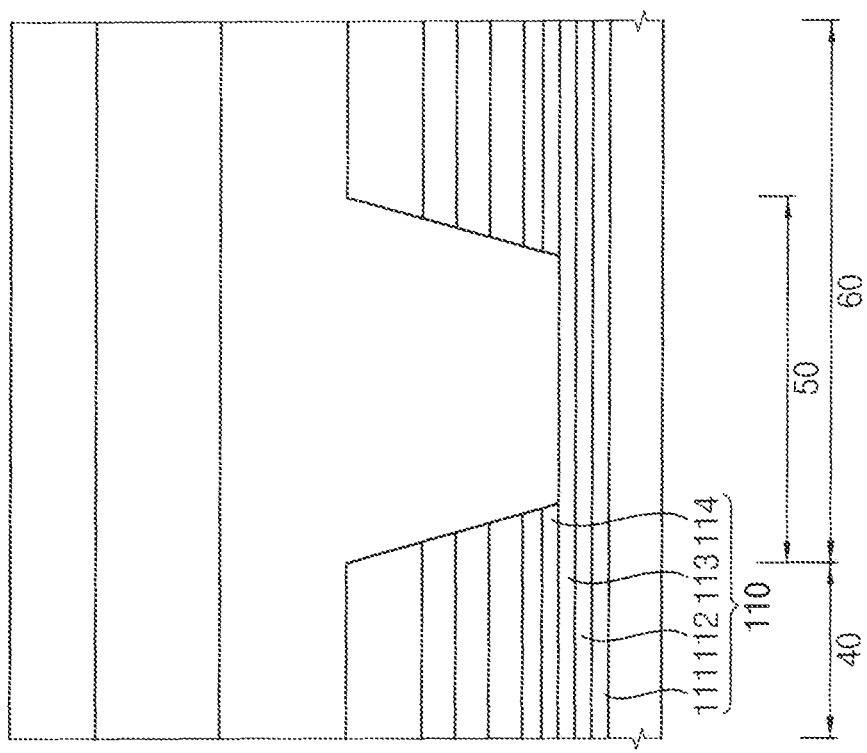
Figure 13:
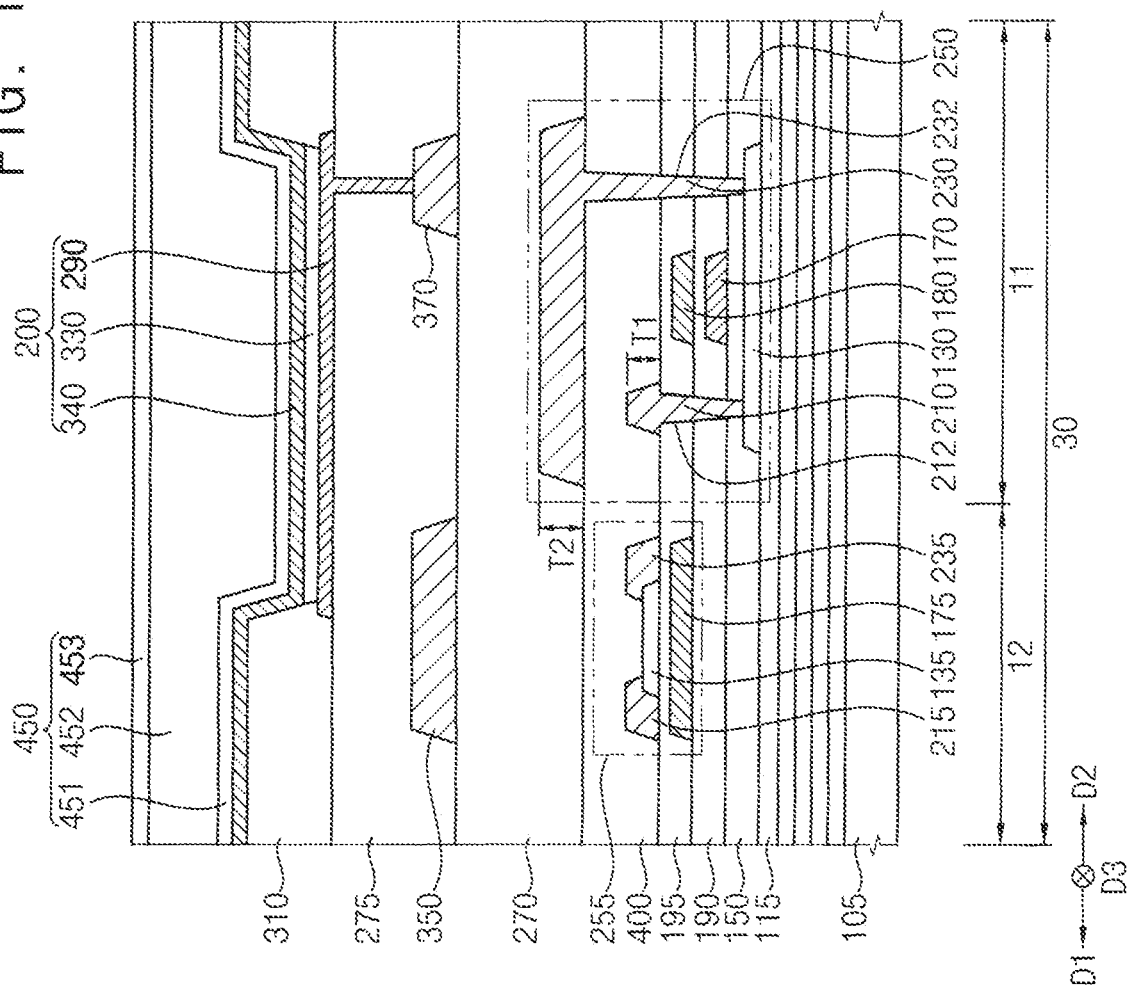

Referring to FIG. 13, a light emitting layer 330 may be formed on the lower electrode 290 exposed by the pixel defining layer 310. The light emitting layer 330 may be formed using at least one of light emitting materials for emitting different color lights (i.e., red light, green light, blue light, etc.) according to sub-pixels. Alternatively, the light emitting layer 330 may be formed by laminating a plurality of light emitting materials for emitting the different color lights such as red light, green light, or blue light to emit white light as a whole. In this case, a color filter may be formed on the light emitting layer 330. The color filter may include at least one of a red color filter, a green color filter, and a blue color filter. Alternatively, the color filter may include a yellow color filter, a cyan color filter, and a magenta color filter. The color filter may be formed using a photosensitive resin, a color photoresist, etc.

An upper electrode 340 may be formed on the pixel defining layer 310 and the light emitting layer 330. The upper electrode 340 may cover the light emitting layer 330 and the pixel defining layer 310 and may be formed entirely on the light emitting layer 330 and the pixel defining layer 310. The upper electrode 340 may be formed using a metal, an alloy of a metal, metal nitride, conductive metal oxide, a transparent conductive material, etc. These may be used alone or in combination with each other. Alternatively, the upper electrode 340 may have a multilayer structure including a plurality of layers. Accordingly, a sub-pixel structure 200 including the lower electrode 290, the light emitting layer 330, and the upper electrode 340 may be formed.

A first thin film encapsulation layer 451 may be formed in the light emitting region 30 on the upper electrode 340. The first thin film encapsulation layer 451 may cover the upper electrode 340 in the light emitting region 30 and may be formed as a substantially uniform thickness along a profile of the upper electrode 340. The first thin film encapsulation layer 451 may prevent the sub-pixel structure 200 from being deteriorated due to penetration of moisture, oxygen, etc. In addition, the first thin film encapsulation layer 451 may function to protect the sub-pixel structure 200 from an external impact. The first thin film encapsulation layer 451 may be formed using a flexible inorganic material.

A second thin film encapsulation layer 452 may be formed in the light emitting region 30 on the first thin film encapsulation layer 451. The second thin film encapsulation layer 452 may improve flatness of an organic light emitting display device and may protect the sub-pixel structure 200. The second thin film encapsulation layer 452 may be formed as a flexible organic material.

A third thin film encapsulation layer 453 may be formed in the light emitting region 30 on the second thin film encapsulation layer 452. The third thin film encapsulation layer 453 may cover the second thin film encapsulation layer 452 in the light emitting region 30 and may be formed as a substantially uniform thickness along a profile of the second thin film encapsulation layer 452. The third thin film encapsulation layer 453 may prevent the sub-pixel structure 200 from being deteriorated due to the penetration of moisture, oxygen, etc., together with the first thin film encapsulation layer 451. In addition, the third thin film encapsulation layer 453 may function to protect the sub-pixel structure 200 from an external impact together with the first thin film encapsulation layer 451 and the second thin film encapsulation layer 452. The third thin film encapsulation layer 453 may include a flexible inorganic material. Accordingly, a thin film encapsulation structure 450 including the first thin film encapsulation layer 451, the second thin film encapsulation layer 452, and the third thin film encapsulation layer 453 may be formed. Alternatively, the thin film encapsulation structure 450 may have a five-layers structure formed by laminating first to fifth thin film encapsulation layers or a seven-layers structure formed by laminating first to seventh thin film encapsulation layers.

After the thin film encapsulation structure 450 is formed, the glass substrate 105 may be removed from the substrate 110, and an OLED display device 100 shown in FIG. 6 may be manufactured.

Figure 14:
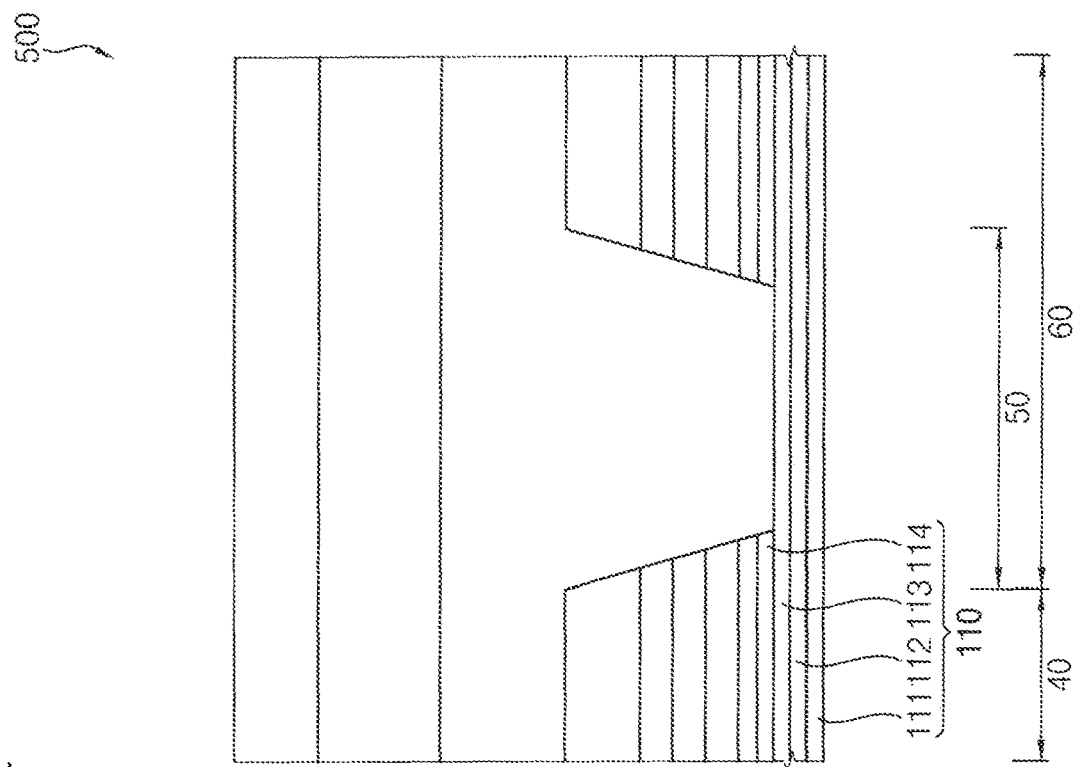
FIG. 14 is a cross-sectional view showing an organic light emitting display device according to embodiments of the present inventive concept.
Figure 14:
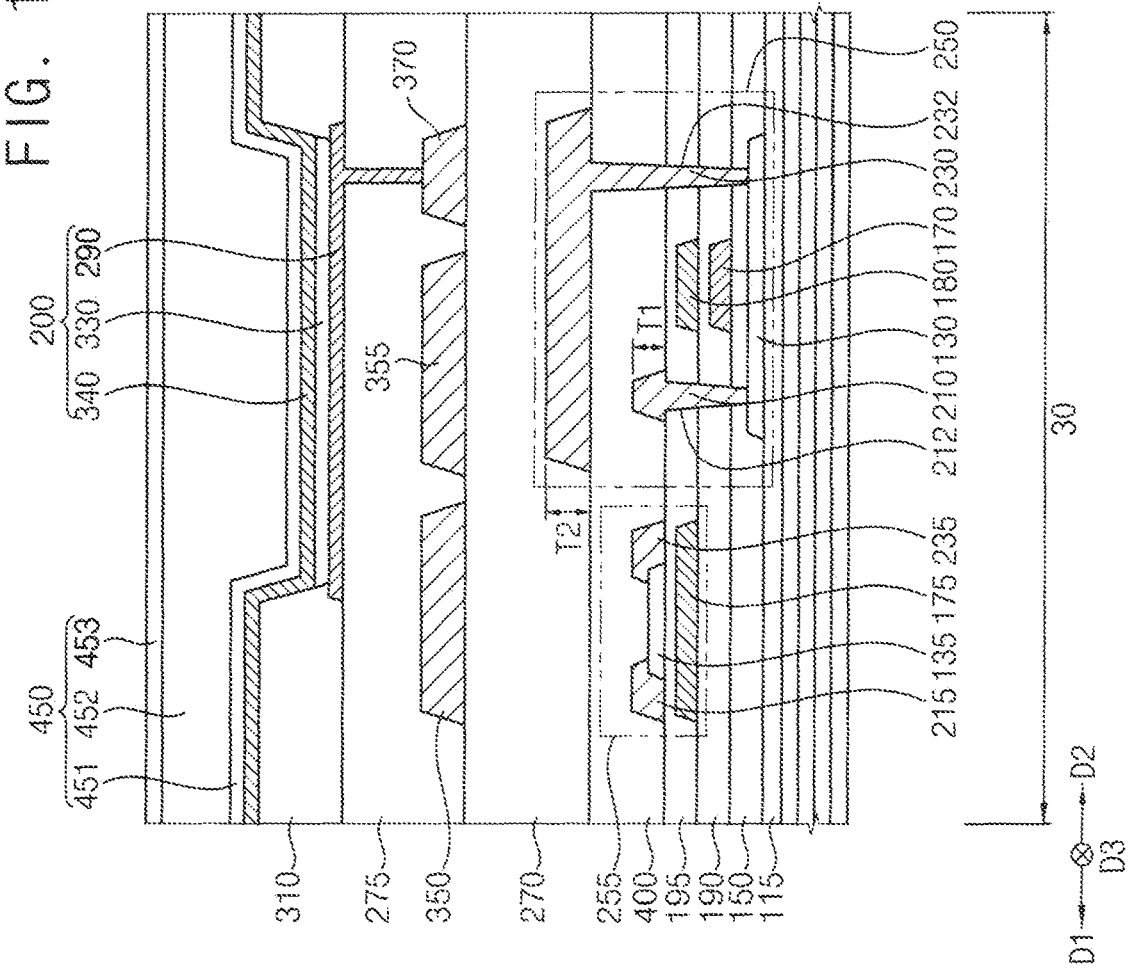
Figure 15:
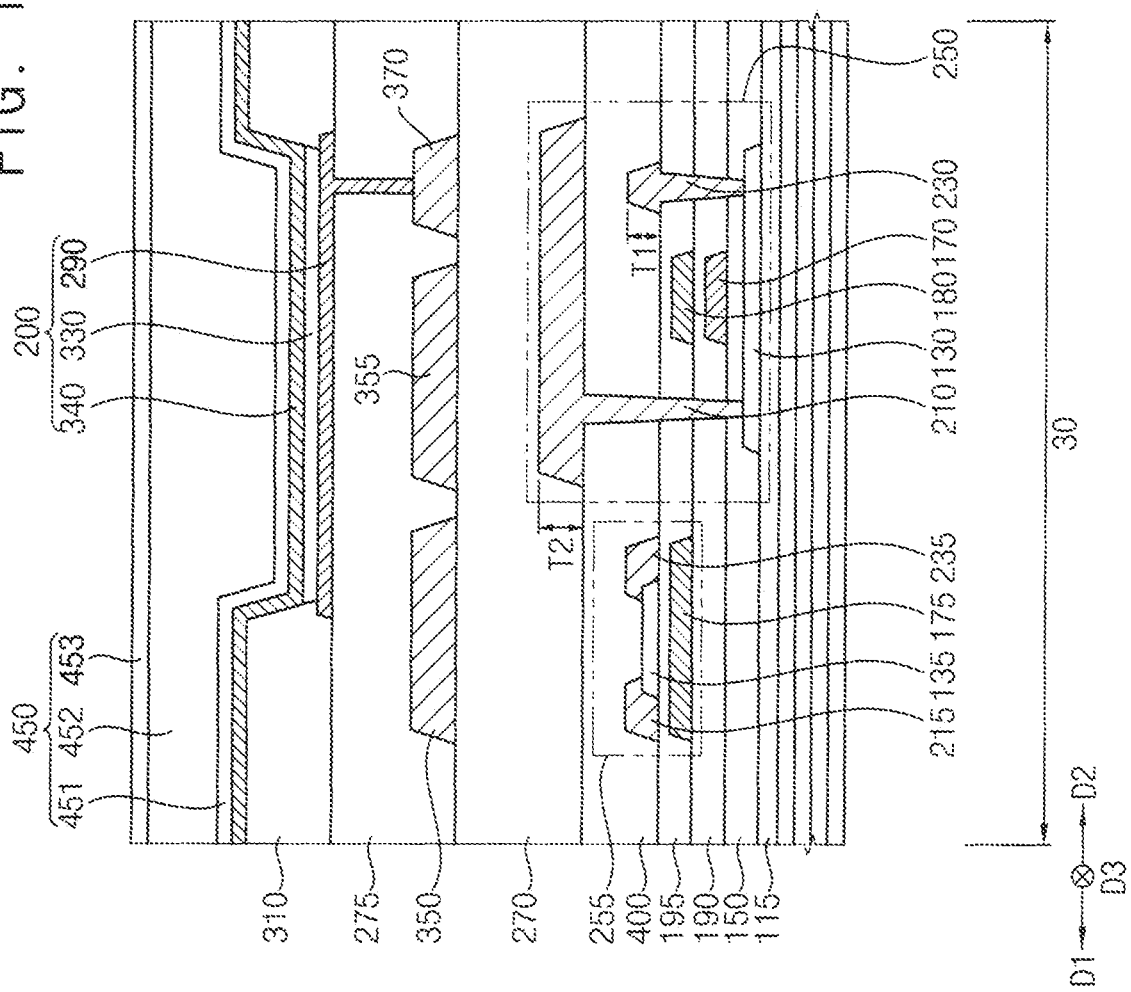
FIG. 15 is a cross-sectional view showing an example of the organic light emitting display device of FIG. 14.

FIG. 14 is a cross-sectional view showing an organic light emitting display device according to embodiments of the present inventive concept, and FIG. 15 is a cross-sectional view showing an example of the organic light emitting display device of FIG. 14. An organic light emitting display device 500 illustrated in FIG. 14 may have a configuration substantially identical or similar to the organic light emitting display device 100 described with reference to FIGS. 1 to 6 except for a first signal wire 350 and a second signal wire 355. In FIG. 14, redundant descriptions for elements substantially identical or similar to the elements described with reference to FIGS. 1 to 6 will be omitted.

Referring to FIG. 14, the organic light emitting display device 500 may include a substrate 110, a buffer layer 115, a driving transistor 250, a switching transistor 255, a gate electrode pattern 180, a gate insulation layer 150, a first insulating interlayer 190, a second insulating interlayer 195, a protective insulating layer 400, a first planarization layer 270, a first signal wire 350, a second signal wire 355, a connection pattern 370, a second planarization layer 275, a sub-pixel structure 200, a pixel defining layer 310, a thin film encapsulation structure 450, etc.

The first signal wire 350 and the second signal wire 355 may be disposed on the first planarization layer 270 and may be spaced apart from each other. A data signal may be applied to the first signal wire 350 and the second signal wire 355. For example, in order to drive the organic light emitting display device 500 at high speed, a sub-pixel circuit SPC of FIG. 5 may include two data wires. For example, since the sub-pixel circuit SPC included in the organic light emitting display device 500 includes two data wires, a speed of transmitting a data signal may be doubled, and the organic light emitting display device 500 may be driven at high speed. Even if the first signal wire 350 and the second signal wire 355 are disposed, the organic light emitting display 500 includes a first drain electrode 230, which has a relatively increased width, to which a constant voltage is applied so that a characteristic of the driving transistor 250 may be maintained uniformly irrelevant to voltages applied to the first signal wire 350 and the second signal wire 355.

In other embodiments, as shown in FIG. 15, compared to FIG. 14, a shape of the first source electrode 210 and a shape of the first drain electrode 230 may be changed. In other words, the first source electrode 210 may be formed of a wire having a relatively large width and a relatively large thickness.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

The present inventive concept may be applied to various electronic devices including an organic light emitting display device. For example, the present inventive concept may be applied to a number of the electronic devices such as vehicle-display devices, ship-display devices, aircraft-display devices, portable communication devices, display devices for display or for information transfer, medical-display devices, etc.

The invention claimed is:

1. An organic light emitting display device comprising:
a substrate including a light emitting region;
a first active layer having a source region and a drain regions disposed in the light emitting region on the substrate;
a gate insulation layer disposed on the first active layer;
a first gate electrode disposed on the gate insulation layer;
a first insulating interlayer disposed on the first gate electrode;
a second insulating interlayer disposed on the first insulating interlayer;
a first source electrode disposed on the second insulating interlayer, the first source electrode being connected to the source region of the first active layer through a contact hole formed in the gate insulation layer, the first insulating interlayer, and the second insulating interlayer;
a protective insulating layer disposed on the first source electrode;
a first drain electrode disposed on the protective insulating layer, the first drain electrode being connected to the drain region of the first active layer through a contact hole formed in the gate insulation layer, the first insulating interlayer, the second insulating interlayer, and the protective insulating layer, the first drain electrode constituting a driving transistor together with the first active layer, the first gate electrode, and the first source electrode;
a switching transistor disposed in the light emitting region between the substrate and the protective insulating layer;
a lower electrode disposed on the switching transistor and the driving transistors;
a light emitting layer disposed on the lower electrode; and
an upper electrode disposed on the light emitting layer.

2. The organic light emitting display device of claim 1, wherein the first drain electrode extends toward the first source electrode.

3. The organic light emitting display device of claim 1 wherein a part of the first drain electrode overlaps the first source electrode.

4. The organic light emitting display device of claim 1, wherein a part of the first drain electrode overlaps the first gate electrode.

5. The organic light emitting display device of claim 1, wherein the first source electrode includes a single layer and the first drain electrode includes a plurality of layers.

6. The organic light emitting display device of claim 5, wherein the first source electrode includes molybdenum and the first drain electrode includes titanium, aluminium and titanium which are sequentially stacked.

7. The organic light emitting display device of claim 1, further comprising:
a signal wire disposed on the first drain electrode.

8. The organic light emitting display device of claim 7, wherein a data signal is applied to the signal wires and a high power supply voltage is applied to the first drain electrode, and
wherein a low power supply voltage is applied to the upper electrode.

9. The organic light emitting display device of claim 1, wherein the switching transistor includes:
a second gate electrode;
a second active layer disposed on the second gate electrode; and
a second source electrode and a second drain electrodes disposed in both lateral portions of the second active layer.

10. The organic light emitting display device of claim 9, wherein the first drain electrode does not overlap the second active layer.

11. The organic light emitting display device of claim 9, wherein the driving transistor has a top gate structures and the first active layer includes a silicon-based semiconductor, and
wherein the switching transistor has a bottom gate structures and the second active layer includes a metal oxide-based semiconductor.

12. The organic light emitting display device of claim 11, wherein the first active layer of the driving transistor includes amorphous silicon or poly silicon.

13. The organic light emitting display device of claim 9, further comprising:
a gate electrode pattern disposed on the first gate electrode.

14. The organic light emitting display device of claim 13, wherein the gate electrode pattern and the second gate electrode are disposed on a same layer.

15. The organic light emitting display device of claim 1, wherein the substrate includes:
a first organic layer;
a first barrier layer disposed on the first organic layer;
a second organic layer disposed on the first barrier layer; and
a second barrier layer disposed on the second organic layer.

16. The organic light emitting display device of claim 15, wherein the substrate further includes:
a bending region spaced apart from the light emitting region, and
wherein the second barrier layer has an opening exposing an upper surface of the second organic layer in an area corresponding to the bending region.

17. The organic light emitting display device of claim 1, wherein the substrate includes:
a first region in which the driving transistor is disposed;
a second region in which the switching transistor is disposed; and
a bending region spaced apart from the light emitting region,
wherein the organic light emitting display device further comprises:
a buffer layer disposed in the first region and the second regions on the substrate, the buffer layer extending into the bending region, the buffer layer having a first opening exposing an upper surface of the substrate disposed in an area corresponding to the bending region,
wherein the gate insulation layer covers the first active layer in the first region on the buffer layer and extends into the bending region, and has a second opening overlapping the first opening, and
wherein the first insulating layer covers the first gate electrode in the first region on the gate insulation layer and extends into the bending region and has a third opening overlapping the first opening and the second openings.

18. The organic light emitting display device of claim 1, further comprising:

a thin film encapsulation structure disposed on the upper electrode,
wherein the thin film encapsulation structure includes:
- a first thin film encapsulation layer including an inorganic material having a flexibility;
- a second thin film encapsulation layer disposed on the first thin film encapsulation layer, the second thin film encapsulation layer including an organic material having a flexibility; and
- a third thin film encapsulation layer disposed on the second thin film encapsulation layer, the third thin film encapsulation layer including an inorganic material having a flexibility.

19. The organic light emitting display device of claim 1, wherein the first source electrode has a first thickness and the first drain electrode has a second thickness greater than the first thickness.

20. An organic light emitting display device comprising:
a substrate including a bending region and a light emitting region;
a driving transistor disposed in the light emitting region on the substrate, the driving transistor including:
- a first active layer having a source region and a drain regions;
- a first gate electrode disposed on the first active layer;
- a first electrode disposed on the first gate electrode, the first electrode being connected to the source region of the first active layer through a first contact hole, the first electrode having a first thickness; and
- a second electrode disposed on the first electrode, the second electrode being connected to the drain region of the first active layer through a second contact hole, the second electrode having a second thickness greater than the first thickness;
a switching transistor disposed in the light emitting region on the substrate; and
a sub pixel structure disposed on the switching and driving transistors.

* * * * *